United States Patent
Jung

(10) Patent No.: US 12,424,266 B2
(45) Date of Patent: Sep. 23, 2025

(54) DATA INPUT/OUTPUT DEVICE FOR PERFORMING DATA INPUT/OUTPUT OPERATION USING PIPE CIRCUIT

(71) Applicant: SK hynix Inc., Gyeonggi-do (KR)

(72) Inventor: In Hwa Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 245 days.

(21) Appl. No.: 18/358,940

(22) Filed: Jul. 26, 2023

(65) Prior Publication Data
US 2024/0290370 A1    Aug. 29, 2024

(30) Foreign Application Priority Data

Feb. 27, 2023    (KR) .......................... 10-2023-0026274

(51) Int. Cl.
*G11C 11/4076*    (2006.01)
*G11C 11/4093*    (2006.01)
*G11C 11/4096*    (2006.01)

(52) U.S. Cl.
CPC ...... *G11C 11/4076* (2013.01); *G11C 11/4093* (2013.01); *G11C 11/4096* (2013.01)

(58) Field of Classification Search
CPC ............ G11C 11/4076; G11C 11/4093; G11C 11/4096
USPC ...................................................... 365/233.1
See application file for complete search history.

(56) References Cited

U.S. PATENT DOCUMENTS

| | | | |
|---|---|---|---|
| 2014/0089575 A1 | 3/2014 | Mes | |
| 2019/0238156 A1* | 8/2019 | Kim | ............... H03K 19/018521 |
| 2020/0143855 A1* | 5/2020 | Kim | ..................... G11C 7/1096 |
| 2020/0314293 A1* | 10/2020 | Sakai | .................. H04N 21/4122 |
| 2023/0206985 A1* | 6/2023 | Nakai | .................. G11C 11/4076 |
| | | | 365/189.15 |

FOREIGN PATENT DOCUMENTS

| | | |
|---|---|---|
| KR | 10-2019-0036895 A | 4/2019 |
| KR | 10-2020-0141173 A | 12/2020 |

* cited by examiner

*Primary Examiner* — Ly D Pham
(74) *Attorney, Agent, or Firm* — IP&T GROUP LLP

(57) ABSTRACT

A data input/output device includes a control circuit configured to generate a plurality input control signals in synchronization with a write clock, to perform a domain crossing operation of converting a write clock into a read clock, and to generate a plurality of output control signals based on an output counting signal generated through the domain crossing operation, and a data input/output circuit configured to latch a plurality of pieces of internal data input in parallel in synchronization with the plurality of input control signals, and to serialize the latched plurality pieces of internal data to generate data in synchronization with the plurality of output control signals.

31 Claims, 22 Drawing Sheets

DATA INPUT/OUTPUT DEVICE FOR PERFORMING DATA INPUT/OUTPUT OPERATION USING PIPE CIRCUIT

CROSS-REFERENCE TO RELATED APPLICATIONS

The present application claims priority under 35 U.S.C. 119(a) to Korean Patent Application No. 10-2023-0026274, filed on Feb. 27, 2023, the entire disclosure of which is incorporated herein by reference.

BACKGROUND

1. Technical Field

The present disclosure relates to a data input/output device for performing a domain crossing operation by latching a write clock as a read clock and performing a data input/output operation using a pipe circuit that outputs parallel data as serial data.

2. Related Art

In general, semiconductor memory devices including double data rate synchronous DRAM (DDR SDRAM) perform read and write operations of data according to commands input from an external chip set. In order for the semiconductor memory device to perform the read and write operations, various circuits need to be provided therein, and among them, there is a pipe circuit for efficiently controlling a large amount of data. In general, the pipe circuit is included in a semiconductor device as a circuit configured to store each of a plurality of input signals at a desired timing and to output the input signals at a desired timing, and can increase the capacity of signal transmission and reception between internal circuits or between an external device of a semiconductor device and an internal circuit of the semiconductor device.

SUMMARY

Embodiments of the present disclosure may provide a data input/output device including a control circuit configured to generate a plurality input control signals in synchronization with a write clock, perform a domain crossing operation of converting a write clock into a read clock, and generate a plurality of output control signals based on an output counting signal generated through the domain crossing operation; and a data input/output circuit configured to latch a plurality of pieces of internal data input in parallel in synchronization with the plurality of input control signals, and serialize the latched plurality pieces of internal data to generate data in synchronization with the plurality of output control signals.

In addition, embodiments of the present disclosure may provide a data input/output device including a control circuit configured to generate a plurality input control signals in synchronization with a write clock, to perform a domain crossing operation by delaying the write clock and a read clock by delay amounts set by a write code and a read code, and to generate a plurality of output control signals based on an output counting signal generated through the domain crossing operation; and a data input/output circuit configured to latch a plurality of pieces of internal data input in parallel in synchronization with the plurality of input control signals, and to serialize the latched plurality of pieces of internal data to generate data in synchronization with the plurality of output control signals.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Moreover, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in more detail with reference to the accompanying drawings. However, the embodiments described herein are for illustrative purposes only and are not intended to limit the scope of the present disclosure.

Figure 1:
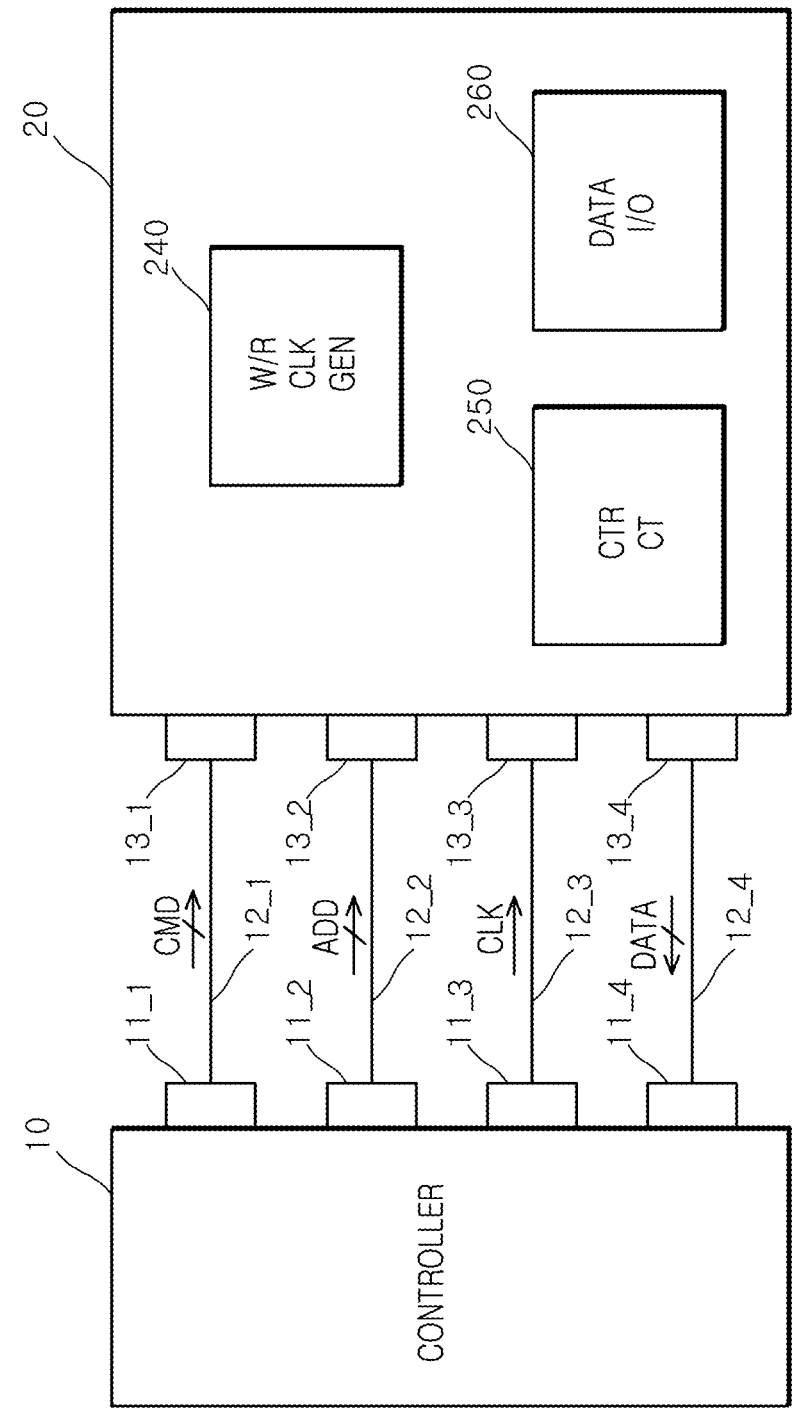
FIG. 1 is a block diagram illustrating a configuration of a system according to an embodiment of the present disclosure.

FIG. 1 is a block diagram illustrating a configuration of a system 1 according to an embodiment of the present disclosure. As shown in FIG. 1, the system 1 may include a controller 10 and a data input/output device 20. The data input/output device 20 may include a write/read clock generation circuit 240, a control circuit 250, and a data input/output circuit 260.

The controller 10 may include a first control pin 11_1, a second control pin 11_2, a third control pin 11_3, and a fourth control pin 11_4. The data input/output device 20 may include a first device pin 13_1, a second device pin 13_2, a third device pin 13_3, and a fourth device pin 13_4. A first transmission line 12_1 may be connected between the first control pin 11_1 and the first device pin 13_1. A second transmission line 12_2 may be connected between the second control pin 11_2 and the second device pin 13_2. A third transmission line 12_3 may be connected between the third control pin 11_3 and the third device pin 13_3. A fourth transmission line 12_4 may be connected between the fourth control pin 11_4 and the fourth device pin 13_4. The controller 10 may transmit a command CMD for controlling the data input/output device 20 through the first transmission line 12_1 to the data input/output device 20. The controller 10 may transmit an address ADD for controlling the data input/output device 20 through the second transmission line 12_2 to the data input/output device 20. The controller 10 may transmit a clock CLK for controlling the data input/output device 20 through the third transmission line 12_3 to the data input/output device 20. The controller 10 may receive data DATA from the data input/output device 20 through the fourth transmission line 12_4. The controller 10 may output the command CMD, the address ADD, and the clock CLK for performing a read operation. The controller 10 may receive the data DATA from the data input/output device 20 during the read operation.

Figure 2:
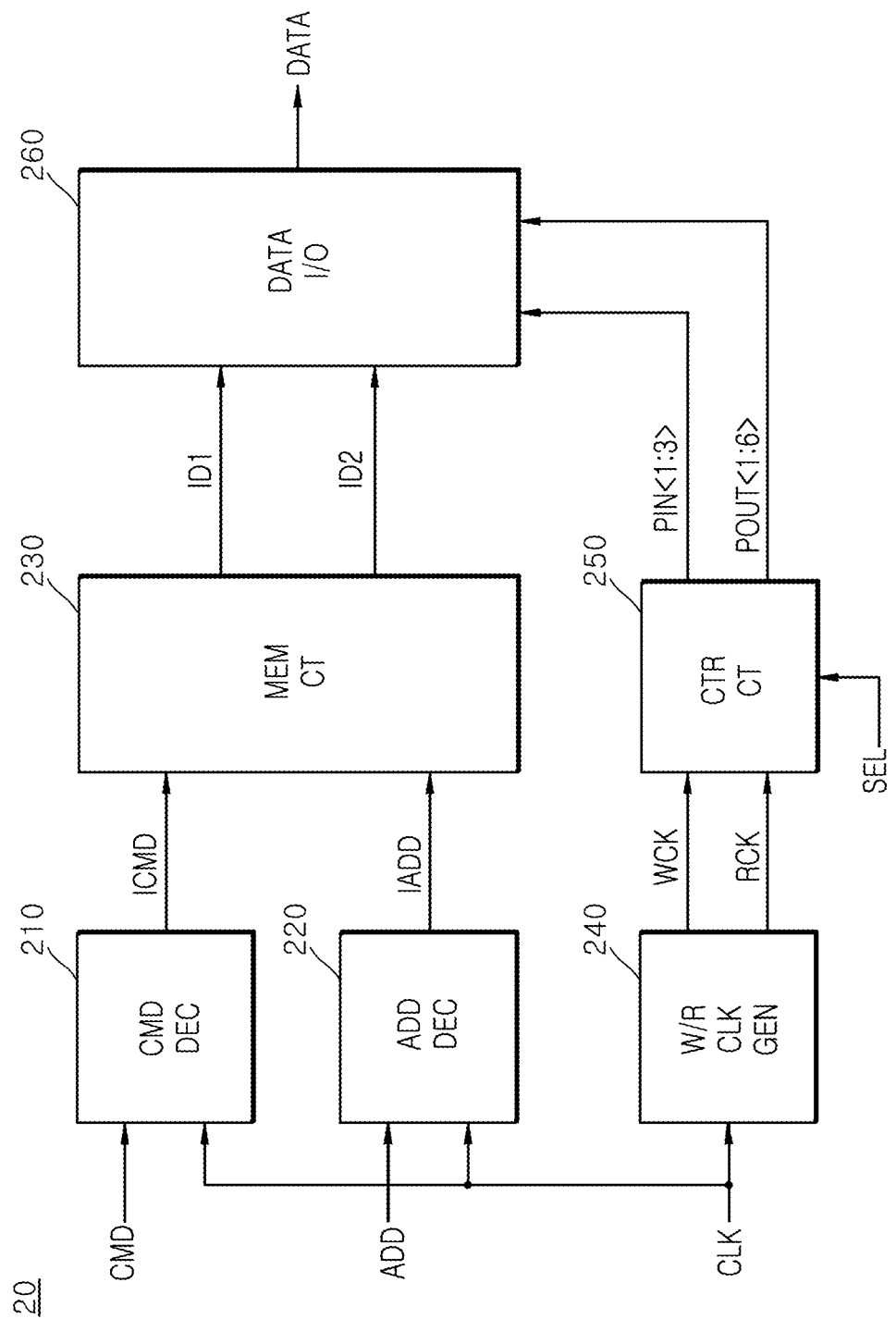
FIG. 2 is a block diagram illustrating a configuration of a data input/output device included in the system shown in FIG. 1, according to an embodiment of the present disclosure.

The write/read clock generation circuit 240 may receive the clock CLK to generate a write clock (WCK of FIG. 2) and a read clock (RCK of FIG. 2). The write/read clock generation circuit 240 may generate the write clock (WCK of FIG. 2) having a frequency ½ times that of the clock CLK. The write read clock generation circuit 240 may generate the read clock (RCK in FIG. 2) having a frequency twice that of the write clock (WCK in FIG. 2).

The control circuit 250 may generate a plurality of input control signals (PIN<1:3> in FIG. 2) in synchronization with the write clock (WCK in FIG. 2). The control circuit 250 may perform a domain crossing operation of converting the write clock (WCK in FIG. 2) into the read clock (RCK in FIG. 2). The control circuit 250 may perform the domain crossing operation to generate a plurality of output control signals (POUT<1:6> in FIG. 2).

The data input/output circuit 260 may latch, in synchronization with the plurality of input control signals (PIN<1:3> in FIG. 2), a plurality of pieces of internal data (ID1 and ID2 in FIG. 2) input in parallel. The data input/output circuit 260 may serialize the latched plurality of pieces of internal data (ID1 and ID2 in FIG. 2) in synchronization with a plurality of output control signals (POUT<1:6> in FIG. 2) to generate the data DATA.

FIG. 2 is a block diagram illustrating a configuration of the data input/output device 20 included in the semiconductor system shown in FIG. 1, according to an embodiment of the present disclosure. As shown in FIG. 2, the data input/output device 20 may include a command decoder 210, an address decoder 220, a memory circuit 230, a write/read clock generation circuit 240, a control circuit 250, and a data input/output circuit 260.

The command decoder 210 may generate an internal command ICMD based on the command CMD in synchronization with the clock CLK. The command decoder 210 may generate the internal command ICMD including a pulse generated when the command CMD input in synchronization with the clock CLK has a logic level combination for performing a read operation. The command decoder 210 may generate the internal command ICMD including a pulse generated by decoding the command CMD input in synchronization with the clock CLK. The command CMD may be set as a signal including a plurality of bits. The command decoder 210 is implemented to generate the internal command ICMD for a read operation, but may be implemented to generate a plurality of internal commands for performing various operations according to embodiments.

The address decoder 220 may generate an internal address IADD based on the address ADD in synchronization with the clock CLK. The address decoder 220 may generate the internal address IADD by decoding the address ADD input in synchronization with the clock CLK. The address ADD may be set to a signal including a plurality of bits. The internal address IADD may be set as a signal including a plurality of bits for selecting a plurality of memory cells (not shown) included in the memory circuit 230.

The memory circuit 230 may be implemented as a general memory circuit including the plurality of memory cells (not shown). The memory circuit 230 may output first internal data ID1 and second internal data ID2 stored in a memory cell (not shown) selected by the internal address IADD upon receiving the internal command ICMD during the read operation. Each of the first internal data ID1 and second internal data ID2 may be set to have a plurality of bits. The first internal data ID1 and second internal data ID2 may be set as parallel data output through different input/output lines.

The write/read clock generation circuit 240 may receive the clock CLK to generate a write clock WCK and a read clock RCK. The write/read clock generation circuit 240 may generate the write clock WCK having a frequency ½ times that of the clock CLK. The write/read clock generation circuit 240 may generate the read clock RCK having a frequency twice that of the write clock WCK. The write/read clock generation circuit 240 may generate the write clock WCK that is periodically toggled in a first mode (2:1 MODE) and the read clock RCK that is periodically toggled at twice the frequency of the write clock WCK. The write clock WCK and the read clock RCK may be generated to have different phases from each other. The write clock WCK and the read clock RCK generated by the write/read clock generation circuit 240 will be described in more detail with reference to FIG. 3 to be described later. According to embodiments, the read clock RCK may be generated as a signal having a frequency 2N times that of the write clock WCK. For example, the read clock RCK may be generated as a signal having various frequencies, such as 2 times, 4 times, 8 times, or 16 times the frequency of the write clock WCK. Here, "N" may be set to a positive integer.

The control circuit 250 may generate first to third input control signals PIN<1:3> in synchronization with the write clock WCK. The control circuit 250 may generate the first to third input control signals PIN<1:3> that are sequentially enabled whenever the write clock WCK is input. For example, the control circuit 250 may generate the first input control signal PIN<1> when the write clock WCK is input, and may generate the second input control signal PIN<2> when the write clock WCK is input again. The control circuit 250 may generate the first input control signal PIN<1> when the write clock WCK is input after generating the third input control signal PIN<3>. The control circuit 250 may perform a domain crossing operation of converting the write clock WCK into the read clock RCK. The control circuit 250 may perform the domain crossing operation by latching the write clock WCK at a rising edge or a falling edge of the read clock RCK by a selection signal SEL. The selection signal SEL may be set as a signal that is enabled when a pulse of the write clock WCK is generated at the falling edge of an odd-numbered pulse of the read clock RCK and disabled when the pulse of the write clock WCK is not generated at the falling edge of the odd-numbered pulse of the read clock RCK. The control circuit 250 may perform the domain crossing operation to generate first to sixth output control signals POUT<1:6>. The control circuit 250 may perform the domain crossing operation, and generate the first to sixth output control signals POUT<1:6> that are sequentially enabled in synchronization with the read clock RCK. For example, the control circuit 250 may perform the domain crossing operation, generate the first output control signal POUT<1> when the read clock RCK is input, and generate the second output control signal POUT<2> when the read clock RCK is input again. The control circuit 250 may generate the first output control signal POUT<1> when the read clock RCK is input after generating the sixth output control signal POUT<6>. According to embodiments, when the read clock RCK is generated as a signal having twice the frequency of the write clock WCK, a number of the plurality of output control signals may be twice greater than a number of the plurality of input control signals. For example, when the number of the plurality of input control signals is three, the number of the plurality of output control signals may be six. The numbers of the plurality of input control signals and the plurality of output control signals may vary according to embodiments.

The data input/output circuit 260 may latch, in synchronization with the first to third input control signals PIN<1:3>, the first internal data ID1 and the second internal data ID2 input in parallel. The data input/output circuit 260 may serialize the latched first internal data ID1 and second internal data ID2 in synchronization with the first to sixth output control signals POUT<1:6> to generate the data DATA. The data DATA may be set to include a plurality of bits. The data DATA may be set as serial data output through one input/output line. The data DATA may be output to the controller (10 of FIG. 1) through the fourth transmission line (12_4 of FIG. 1).

Figure 3:
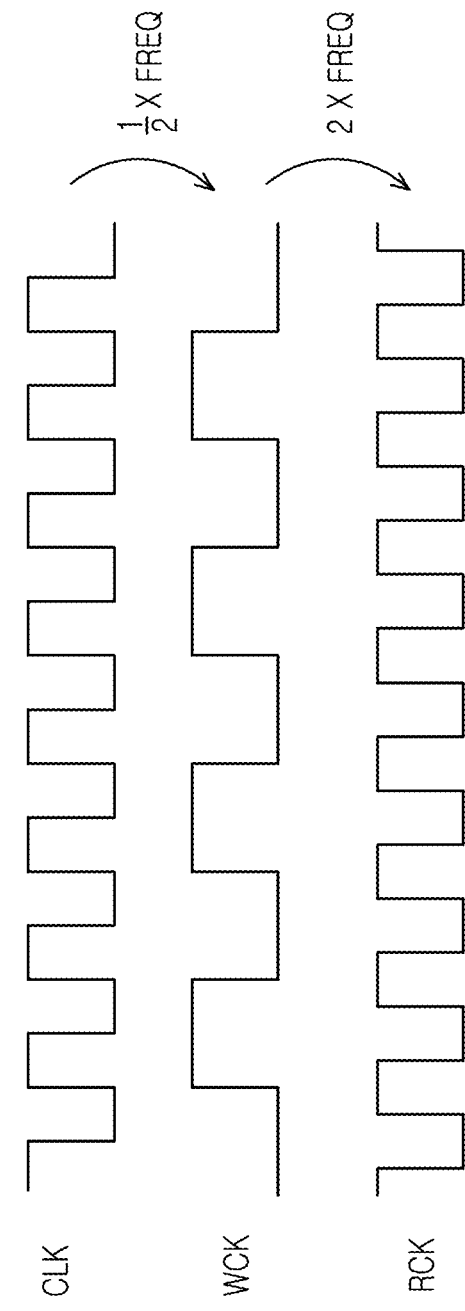
FIG. 3 is a diagram illustrating an operation of a write/read clock generation circuit included in the data input/output device shown in FIG. 2, according to an embodiment of the present disclosure.

FIG. 3 is a diagram illustrating an operation of the write/read clock generation circuit 240 included in the data input/output device 20 shown in FIG. 2, according to an embodiment of the present disclosure. The operation of the write/read clock generation circuit (240 of FIG. 2) according to an embodiment of the present disclosure will be described with reference to FIG. 3, together with FIG. 2, but the operation of generating the write clock WCK and the read clock RCK in the first mode (2:1 MODE) will be described below.

The first mode (2:1 MODE) may refer to an operation mode in which the read clock RCK has a frequency twice that of the write clock WCK.

The write/read clock generation circuit 240 may generate the write clock WCK having a frequency ½ times the frequency (½×FREQ) of the clock CLK in the first mode (2:1 MODE). The write/read clock generation circuit 240 may generate the write clock WCK having a ½ cycle during the one cycle of the clock CLK in the first mode (2:1 MODE).

The write/read clock generation circuit 240 may generate the read clock RCK having a frequency twice (2×FREQ)

that of the write clock WCK in the first mode (2:1 MODE). The write/read clock generation circuit 240 may generate the read clock RCK having two cycles during the one cycle of the write clock WCK in the first mode (2:1 MODE).

Figure 4:
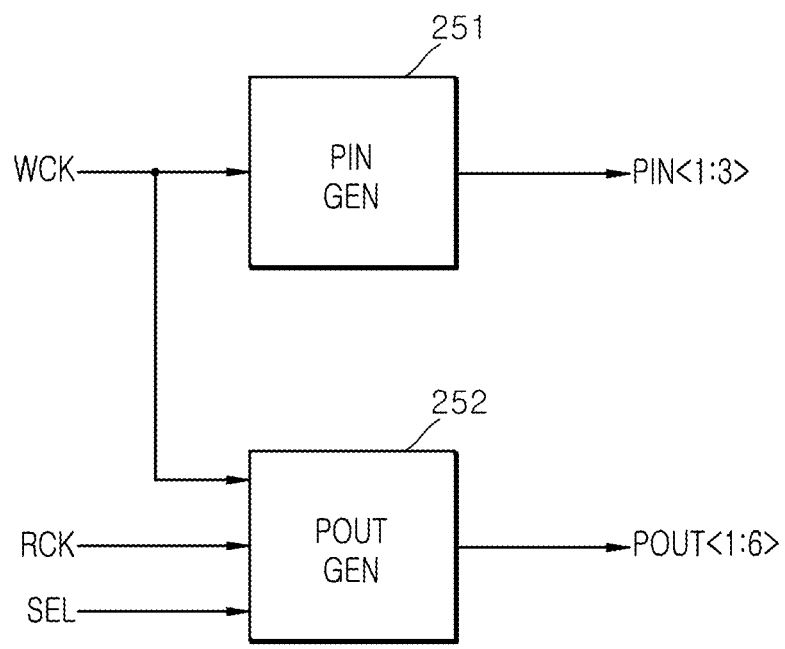
FIG. 4 is a block diagram illustrating a configuration of a control circuit included in the data input/output device shown in FIG. 2, according to an embodiment of the present disclosure.

FIG. 4 is a block diagram illustrating a configuration of the control circuit 250 included in the data input/output device 20 shown in FIG. 2, according to an embodiment of the present disclosure. The control circuit 250 may include an input control signal generation circuit 251 and an output control signal generation circuit 252.

The input control signal generation circuit 251 may generate the first to third input control signals PIN<1:3> in synchronization with the write clock WCK. The input control signal generation circuit 251 may generate the first to third input control signals PIN<1:3> that are sequentially enabled whenever the write clock WCK is input. The input control signal generation circuit 251 may generate the first input control signal PIN<1> that is enabled when the write clock WCK is input for the first time. The input control signal generation circuit 251 may generate the second input control signal PIN<2> that is enabled when the write clock WCK is input for the second time. The input control signal generation circuit 251 may generate the third input control signal PIN<3> that is enabled when the write clock WCK is input for the third time. The input control signal generation circuit 251 may generate the first input control signal PIN<1> that is enabled when the write clock WCK is input for the fourth time.

The output control signal generation circuit 252 may perform the domain crossing operation by latching the write clock WCK at the rising edge or the falling edge of the read clock RCK by the selection signal SEL. The output control signal generation circuit 252 may perform the domain crossing operation by latching the write clock WCK at the falling edge of the read clock RCK when the selection signal SEL is enabled. The output control signal generation circuit 252 may perform the domain crossing operation by latching the write clock WCK at the rising edge of the read clock RCK when the selection signal SEL is disabled. The output control signal generation circuit 252 may perform the domain crossing operation, and generate the first to sixth output control signals POUT<1:6> that are sequentially enabled in synchronization with the read clock RCK.

Figure 5:
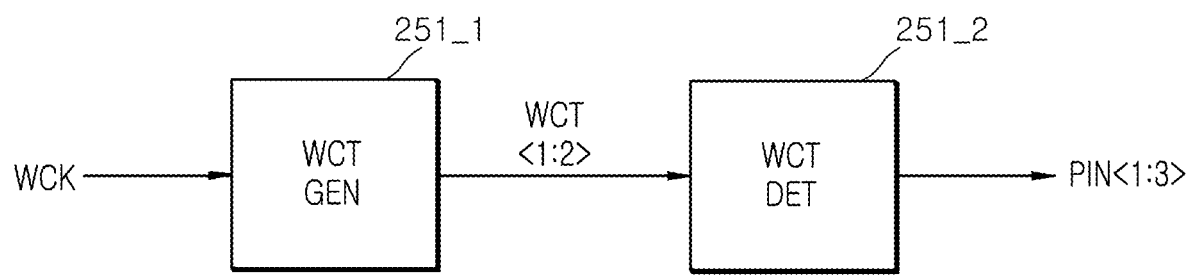
FIG. 5 is a block diagram illustrating a configuration of an input control signal generation circuit included in the control circuit shown in FIG. 4, according to an embodiment of the present disclosure.

FIG. 5 is a block diagram illustrating a configuration of the input control signal generation circuit 251 included in the control circuit 250 shown in FIG. 4, according to an embodiment of the present disclosure. The input control signal generation circuit 251 may include a write counting signal generation circuit 251_1 and a write counting signal detection circuit 251_2.

The write counting signal generation circuit 251_1 may generate first and second write counting signals WCT<1:2> that are sequentially counted in synchronization with the rising edge of the write clock WCK. The write counting signal generation circuit 251_1 may generate the first and second write counting signals WCT<1:2> that are up-counted from "10" to "00" in synchronization with the rising edge of the write clock WCK when the write clock WCK is input for the first time. The write counting signal generation circuit 251_1 may generate the first and second write counting signals WCT<1:2> that are up-counted from "00" to "01" in synchronization with the rising edge of the write clock WCK when the write clock WCK is input for the second time. The write counting signal generation circuit 251_1 may generate the first and second write counting signals WCT<1:2> that are up-counted from "01" to "10" in synchronization with the rising edge of the write clock WCK when the write clock WCK is input for the third time. The write counting signal generation circuit 251_1 may generate the first and second write counting signals WCT<1:2> that are up-counted from "10" to "00" in synchronization with the rising edge of the write clock WCK when the write clock WCK is input for the fourth time. The first and second write counting signals WCT<1:2> that are up-counted to "10" may mean that the first write counting signal WCT<1> is generated to have a logic "high" level '1' and the second write counting signal WCT<2> is generated to have a logic "low" level '0'.

The write counting signal detection circuit 251_2 may detect a logic level combination of the first and second write counting signals WCK<1:2> to generate the first to third input control signals PIN<1:3>. The write counting signal detection circuit 251_2 may generate the first input control signal PIN<1> that is enabled when the first and second write counting signals WCK<1:2> are generated as "00". The write counting signal detection circuit 251_2 may generate the second input control signal PIN<2> that is enabled when the first and second write counting signals WCK<1:2> are generated as "01". The write counting signal detection circuit 251_2 may generate the third input control signal PIN<3> that is enabled when the first and second write counting signals WCK<1:2> are generated as "10".

Figure 6:
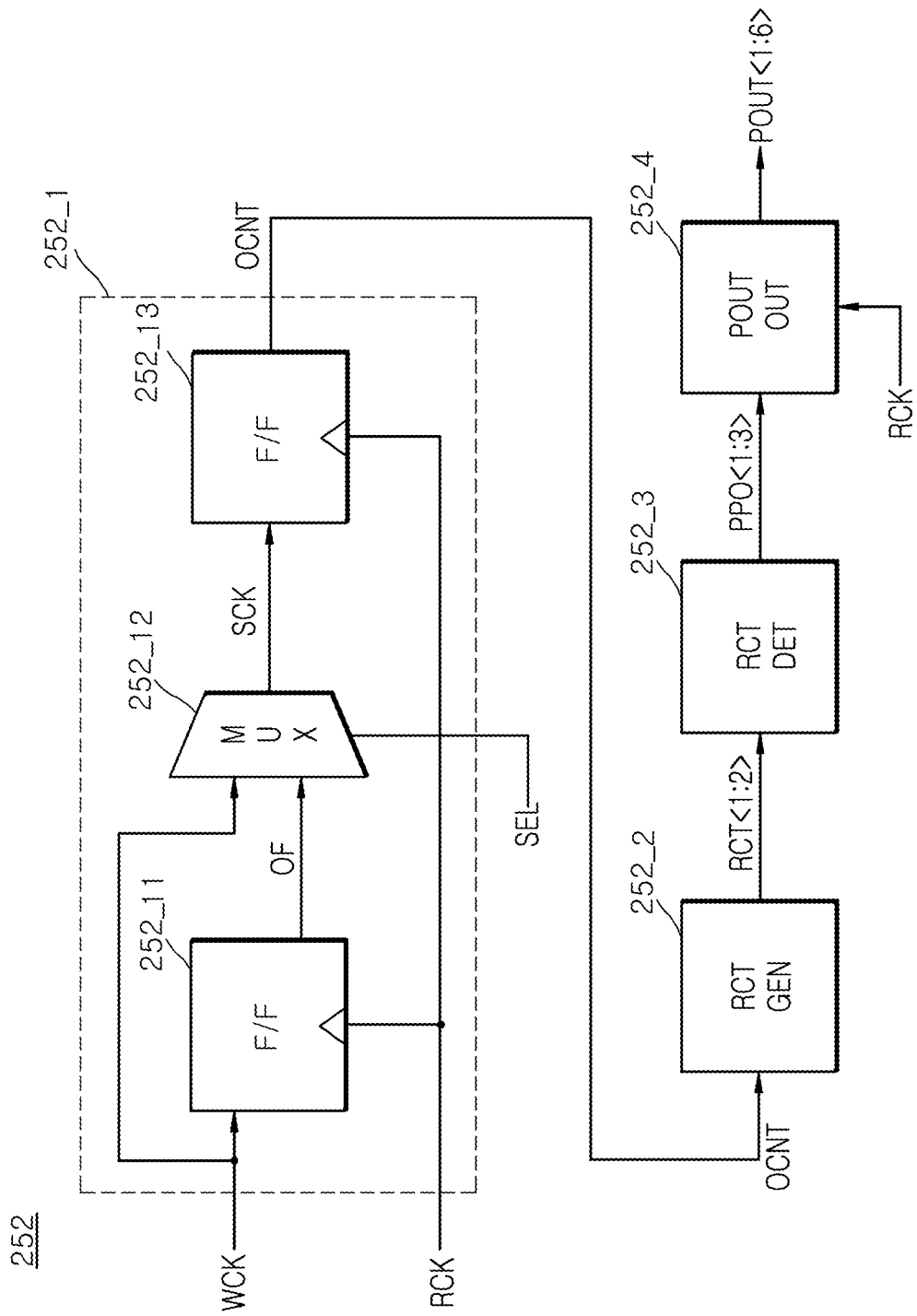
FIG. 6 is a block diagram illustrating a configuration of an output control signal generation circuit included in the control circuit shown in FIG. 4, according to an embodiment of the present disclosure.

FIG. 6 is a block diagram illustrating a configuration of the output control signal generation circuit 252 included in the control circuit 250 shown in FIG. 4, according to an embodiment of the present disclosure. The output control signal generation circuit 252 may include an output counting signal generation circuit 252_1, a read counting signal generation circuit 252_2, a read counting signal detection circuit 252_3, and an output control signal output circuit 252_4.

The output counting signal generation circuit 252_1 may be implemented with a flip-flop 252_11, a multiplexer 252_12, and a flip-flop 252_13. The flip-flop 252_11 may latch the write clock WCK at the falling edge of the read clock RCK to generate a falling detection signal OF. The multiplexer 252_12 may output the falling detection signal OF as a selection clock SCK when the selection signal SEL is enabled at a logic "high" level. The multiplexer 252_12 may output the write clock WCK as the selection clock SCK when the selection signal SEL is disabled at a logic "low" level. The flip-flop 252_13 may latch the selection clock SCK at the rising edge of the read clock RCK to generate an output counting signal OCNT.

The output counting signal generation circuit 252_1 may perform, in order to generate the output counting signal OCNT, the domain crossing operation by latching the write clock WCK at the falling edge of the read clock RCK or latching the write clock WCK at the rising edge of the read clock RCK based on the selection signal SEL. The output counting signal generation circuit 252_1 may perform, in order to generate the output counting signal OCNT, the domain crossing operation by latching the write clock WCK at the falling edge of the read clock RCK when the selection signal SEL is enabled at a logic "high" level. The output counting signal generation circuit 252_1 may perform, in order to generate the output counting signal OCNT, the domain crossing operation by latching the write clock WCK at the rising edge of the read clock RCK when the selection signal SEL is disabled at a logic "low" level.

The read counting signal generation circuit 252_2 may generate first and second read counting signals RCT<1:2> that are sequentially counted in synchronization with a falling edge of the output counting signal OCNT. The read counting signal generation circuit 252_2 may generate the first and second read counting signals RCT<1:2> that are up-counted from "10" to "00" in synchronization with the falling edge of the output counting signal OCNT when the output counting signal OCNT is input for the first time. The read counting signal generation circuit 252_2 may generate the first and second read counting signals RCT<1:2> that are up-counted from "00" to "01" in synchronization with the falling edge of the output counting signal OCNT when the output counting signal OCNT is input for the second time. The read counting signal generation circuit 252_2 may generate the first and second read counting signals RCT<1:2> that are up-counted from "01" to "10" in synchronization with the falling edge of the output counting signal OCNT when the output counting signal OCNT is input for the third time. The read counting signal generation circuit 252_2 may generate the first and second read counting signals RCT<1:2> that are up-counted from "10" to "00" in synchronization with the falling edge of the output counting signal OCNT when the output counting signal OCNT is input for the fourth time. The first and second read counting signals RCT<1:2> up-counted to "10" may mean that the first read counting signal RCT<1> is generated at a logic "high" level '1', and the second read counting signal RCT<2> is generated at a logic "low" level '0'.

The read counting signal detection circuit 252_3 may detect the logic level combination of the first and second read counting signals RCT<1:2> to generate first to third pre-output control signals PPO<1:3>. The read counting signal detection circuit 252_3 may generate the first pre-output control signal PPO<1> that is enabled when the first and second read counting signals RCT<1:2> are generated as "00". The read counting signal detection circuit 252_3 may generate the second pre-output control signal PPO<2> that is enabled when the first and second read counting signals RCT<1:2> are generated as "01". The read counting signal detection circuit 252_3 may generate the third pre-output control signal PPO<3> that is enabled when the first and second read counting signals RCT<1:2> are generated as "10".

The output control signal output circuit 252_4 may generate the first to sixth output control signals POUT<1:6> that are sequentially enabled based on the first to third pre-output control signals PPO<1:3> in synchronization with the read clock RCK. The output control signal output circuit 252_4 may generate the first and second output control signals POUT<1:2> that are sequentially enabled in synchronization with the rising edge of the read clock RCK when the first pre-output control signal PPO<1> is enabled. The output control signal output circuit 252_4 may generate the third and fourth output control signals POUT<3:4> that are sequentially enabled in synchronization with the rising edge of the read clock RCK when the second pre-output control signal PPO<2> is enabled. The output control signal output circuit 252_4 may generate the fifth and sixth output control signals POUT<5:6> that are sequentially enabled in synchronization with the rising edge of the read clock RCK when the third pre-output control signal PPO<3> is enabled.

Figure 7:
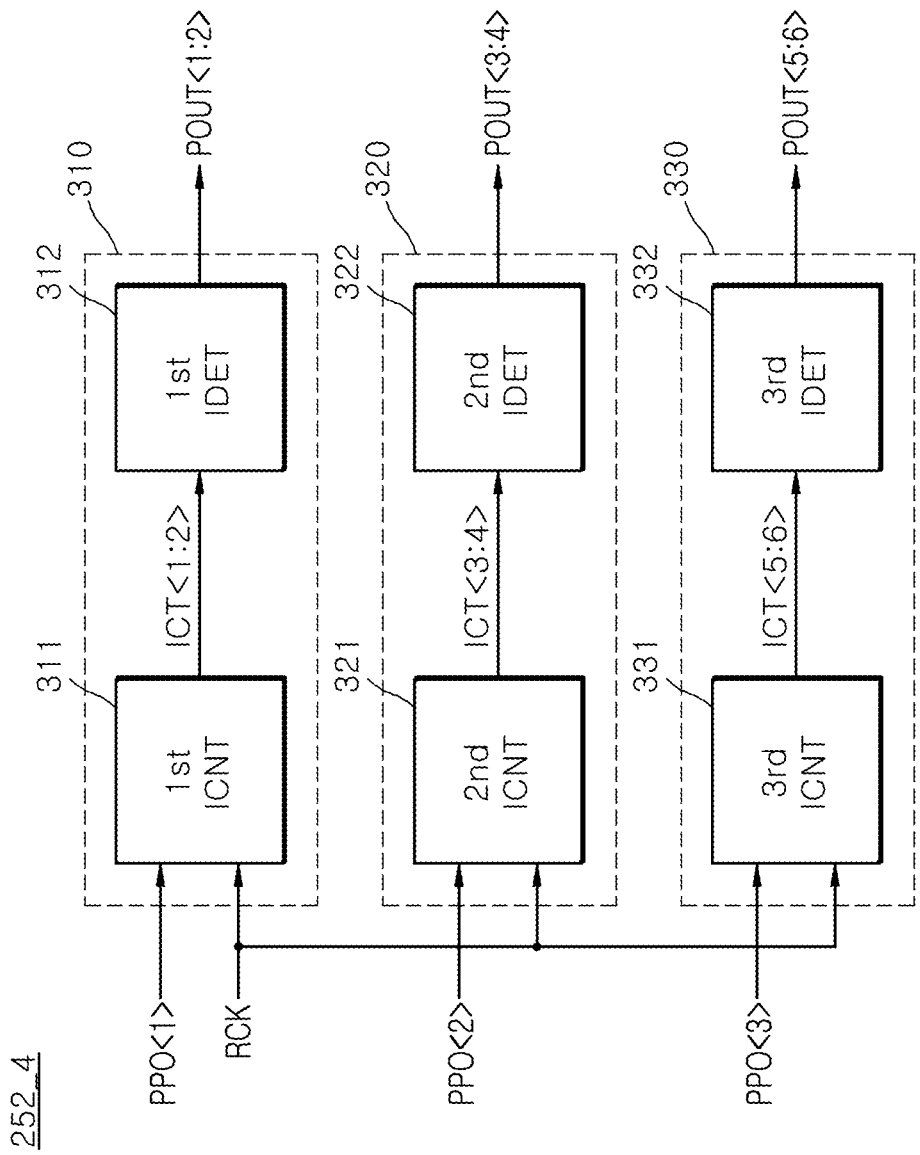
FIG. 7 is a block diagram illustrating a configuration of an output control signal output circuit included in the output control signal generation circuit shown in FIG. 6, according to an embodiment of the present disclosure.

FIG. 7 is a block diagram illustrating a configuration of the output control signal output circuit 252_4 included in the output control signal generation circuit 252 shown in FIG. 6, according to an embodiment of the present disclosure. The output control signal output circuit 252_4 may include a first output control circuit 310, a second output control circuit 320, and a third output control circuit 330.

The first output control circuit 310 may include a first internal counter 311 and a first internal detection circuit 312.

The first internal counter 311 may generate first and second internal counting signals ICT<1:2> that are sequentially counted in synchronization with the rising edge of the read clock RCK when the first pre-output control signal PPO<1> is enabled. The first internal counter 311 may generate the first and second internal counting signals ICT<1:2> that are up-counted from "00" to "01" in synchronization with the rising edge of the read clock RCK when the first pre-output control signal PPO<1> is enabled. The first internal counter 311 may generate the first and second internal counting signals ICT<1:2> that are up-counted from "01" to "10" in synchronization with the rising edge of the read clock RCK when the first pre-output control signal PPO<1> is enabled. The first internal counter 311 may generate the first and second internal counting signals ICT<1:2> that are initialized to "00" when the first pre-output control signal PPO<1> is disabled.

The first internal detection circuit 312 may detect the logic level combination of the first and second internal counting signals ICT<1:2> to generate the first and second output control signals POUT<1:2>. The first internal detection circuit 312 may generate the first output control signal POUT<1> that is enabled when the first and second internal counting signals ICT<1:2> are generated as "01". The first internal detection circuit 312 may generate the second output control signal POUT<2> that is enabled when the first and second internal counting signals ICT<1:2> are generated as "10".

The second output control circuit 320 may include a second internal counter 321 and a second internal detection circuit 322.

The second internal counter 321 may generate third and fourth internal counting signals ICT<3:4> that are sequentially counted in synchronization with the rising edge of the read clock RCK when the second pre-output control signal PPO<2> is enabled. The second internal counter 321 may generate the third and fourth internal counting signals ICT<3:4> that are up-counted from "00" to "01" in synchronization with the rising edge of the read clock RCK when the second pre-output control signal PPO<2> is enabled. The second internal counter 321 may generate the third and fourth internal counting signals ICT<3:4> that are up-counted from "01" to "10" in synchronization with the rising edge of the read clock RCK when the second pre-output control signal PPO<2> is enabled. The second internal counter 321 may generate the third and fourth internal counting signals ICT<3:4> that are initialized to "00" when the second pre-output control signal PPO<2> is disabled.

The second internal detection circuit 322 may detect the logic level combination of the third and fourth internal counting signals ICT<3:4> to generate the third and fourth output control signals POU<3:4>. The second internal detection circuit 322 may generate the third output control signal POUT<3> that is enabled when the third and fourth internal counting signals ICT<3:4> are generated as "01". The second internal detection circuit 322 may generate the fourth output control signal POUT<4> that is enabled when the third and fourth internal counting signals ICT<3:4> are generated as "10".

The third output control circuit 330 may include a third internal counter 331 and a third internal detection circuit 332.

The third internal counter 331 may generate fifth and sixth internal counting signals ICT<5:6> that are sequentially counted in synchronization with the rising edge of the read clock RCK when the third pre-output control signal PPO<3> is enabled. The third internal counter 331 may generate the fifth and sixth internal counting signals ICT<5:6> that are up-counted from "00" to "01" in synchronization with the rising edge of the read clock RCK when the third pre-output control signal PPO<3> is enabled. The third internal counter 331 may generate the fifth and sixth internal counting signals ICT<5:6> that are up-counted from "01" to "10" in synchronization with the rising edge of the read clock RCK when the third pre-output control signal PPO<3> is enabled. The third internal counter 331 may generate the fifth and sixth internal counting signals ICT<5:6> that are initialized to "00" when the third pre-output control signal PPO<3> is disabled.

The third internal detection circuit 332 may detect the logic level combination of the fifth and sixth internal counting signals ICT<5:6> to generate the fifth and sixth output control signals POUT<5:6>. The third internal detection circuit 332 may generate the fifth output control signal POUT<5> that is enabled when the fifth and sixth internal counting signals ICT<5:6> are generated as "01". The third internal detection circuit 332 may generate the sixth output control signal POUT<6> that is enabled when the fifth and sixth internal counting signals ICT<5:6> are generated as "10".

Figure 8:
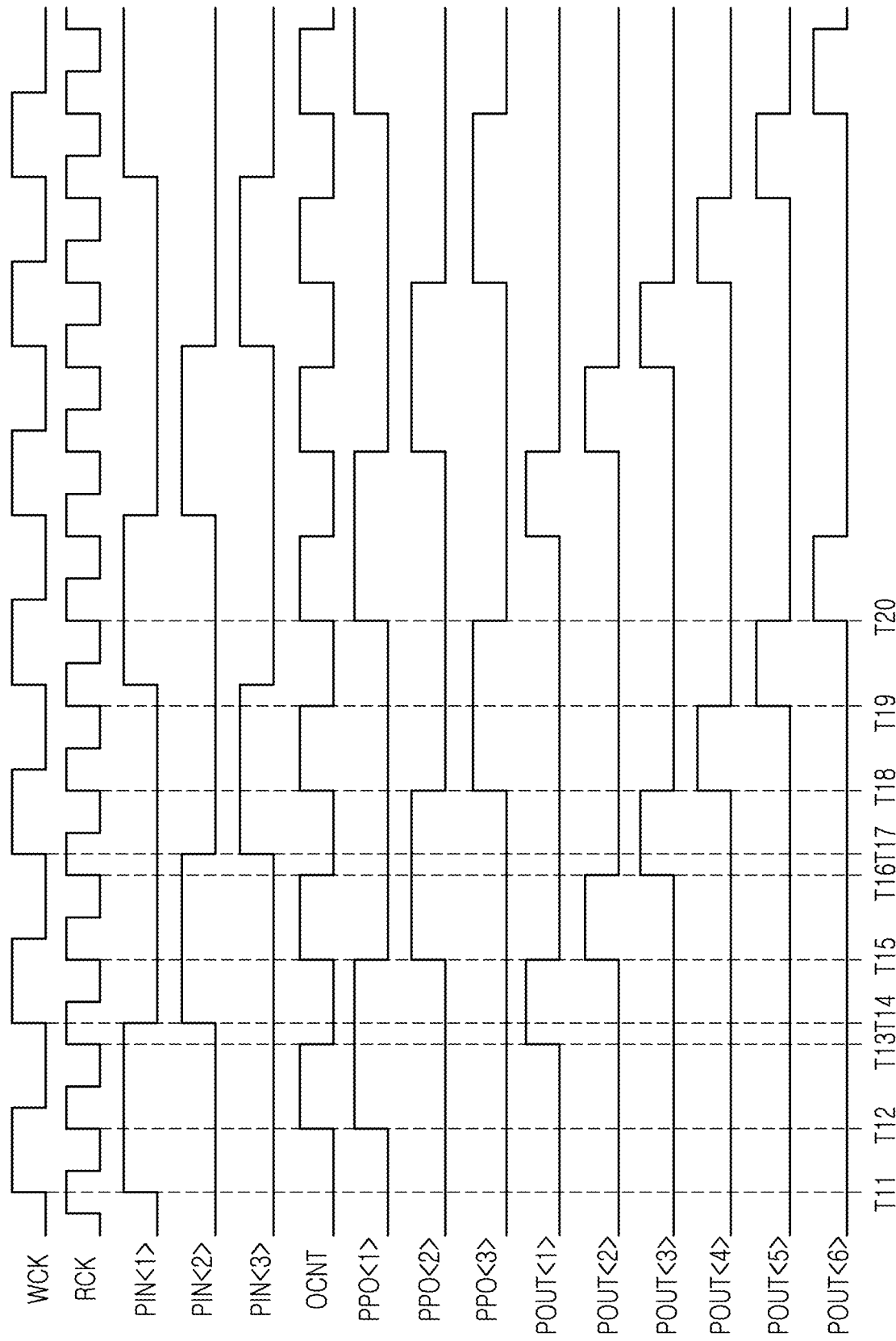
FIG. 8 is a timing diagram illustrating an operation of the control circuit included in FIGS. 4 to 7, according to an embodiment of the present disclosure.

FIG. 8 is a block diagram illustrating an operation of the control circuit 250 included in FIGS. 4 to 7, according to an embodiment of the present disclosure. The operation of the control circuit 250 will be described with reference to FIG. 8, together with FIGS. 4 to 7, as follows.

At the time of T11, the input control signal generation circuit 251 may generate the first input control signal PIN<1> that is enabled at a logic "high" level when the write clock WCK is input for the first time.

At the time of T12, the output counting signal generation circuit 252_1 of the output control signal generation circuit 252 may perform a domain crossing operation by latching the write clock WCK at a falling edge of the read clock RCK when the selection signal SEL is enabled at a logic "high" level to generate the output counting signal OCNT of a logic "high" level. The read counting signal generation circuit 252_2 may generate the first and second read counting signals RCT<1:2> that are up-counted from "10" to "00" in synchronization with the falling edge of the output counting signal OCNT when the output counting signal OCNT is input for the first time. The read counting signal detection circuit 252_3 may generate the first pre-output control signal PPO<1> that is enabled at a logic "high" level when the first and second read counting signals RCT<1:2> are generated as "00".

At the time of T13, the output control signal output circuit 252_4 may output the first output control signal POUT<1> that is enabled at a logic "high" level in synchronization with the rising edge of the read clock RCK after the first pre-output control signal PPO<1> is enabled at a logic "high" level.

At the time of T14, the input control signal generation circuit 251 may generate the second input control signal PIN<2> that is enabled at a logic "high" level when the write clock WCK is input for the second time.

At the time of T15, the output control signal output circuit 252_4 may generate the second output control signal POUT<2> that is enabled at a logic "high" level in synchronization with the rising edge of the read clock RCK.

The output counting signal generation circuit 252_1 of the output control signal generation circuit 252 may perform the domain crossing operation by latching the write clock WCK at the falling edge of the read clock RCK to generate the output counting signal OCNT of a logic "high" level when the selection signal SEL is enabled at a logic "high" level. The read counting signal generation circuit 252_2 may generate the first and second read counting signals RCT<1:2> that are up-counted from "00" to "01" in synchronization with the falling edge of the output counting signal OCNT when the output counting signal OCNT is input for the second time. The read counting signal detection circuit 252_3 may generate the second pre-output control signal PPO<2> that is enabled at a logic "high" level when the first and second read counting signals are generated as "01".

At the time of T16, the output control signal output circuit 252_4 may generate the third output control signal POUT<3> that is enabled in synchronization with the rising edge of the read clock RCK after the second pre-output control signal PPO<2> is enabled at a logic "high" level.

At the time of T17, the input control signal generation circuit 251 may generate the third input control signal PIN<3> that is enabled at a logic "high" level when the write clock WCK is input for the third time.

At the time of T18, the output control signal output circuit 252_4 may generate the fourth output control signal POUT<4> that is enabled at a logic "high" level in synchronization with the rising edge of the read clock RCK.

The output counting signal generation circuit 252_1 of the output control signal generation circuit 252 may perform the domain crossing operation by latching the write clock WCK at the falling edge of the read clock RCK to generate the output counting signal OCNT of a logic "high" level when the selection signal SEL is enabled at a logic "high" level. The read counting signal generation circuit 252_2 may generate the first and second read counting signals RCT<1:2> that are up-counted from "01" to "10" in synchronization with the falling edge of the output counting signal OCNT when the output counting signal OCNT is input for the third time. The read counting signal detection circuit 252_3 may generate the third pre-output control signal PPO<3> that is enabled at a logic "high" level when the first and second read counting signals RCT<1:2> are generated at the logic level of "10".

At the time of T19, the output control signal output circuit 252_4 may generate the fifth output control signal POUT<5> that is enabled at a logic "high" level in synchronization with the rising edge of the read clock RCK after the third pre-output control signal PPO<3> is enabled at a logic "high" level.

At the time of T20, the output control signal output circuit 252_4 may generate the sixth output control signal POUT<6> that is enabled at a logic "high" level in synchronization with the rising edge of the read clock RCK after the third pre-output control signal PPO<3> is enabled at a logic "high" level.

Figure 9:
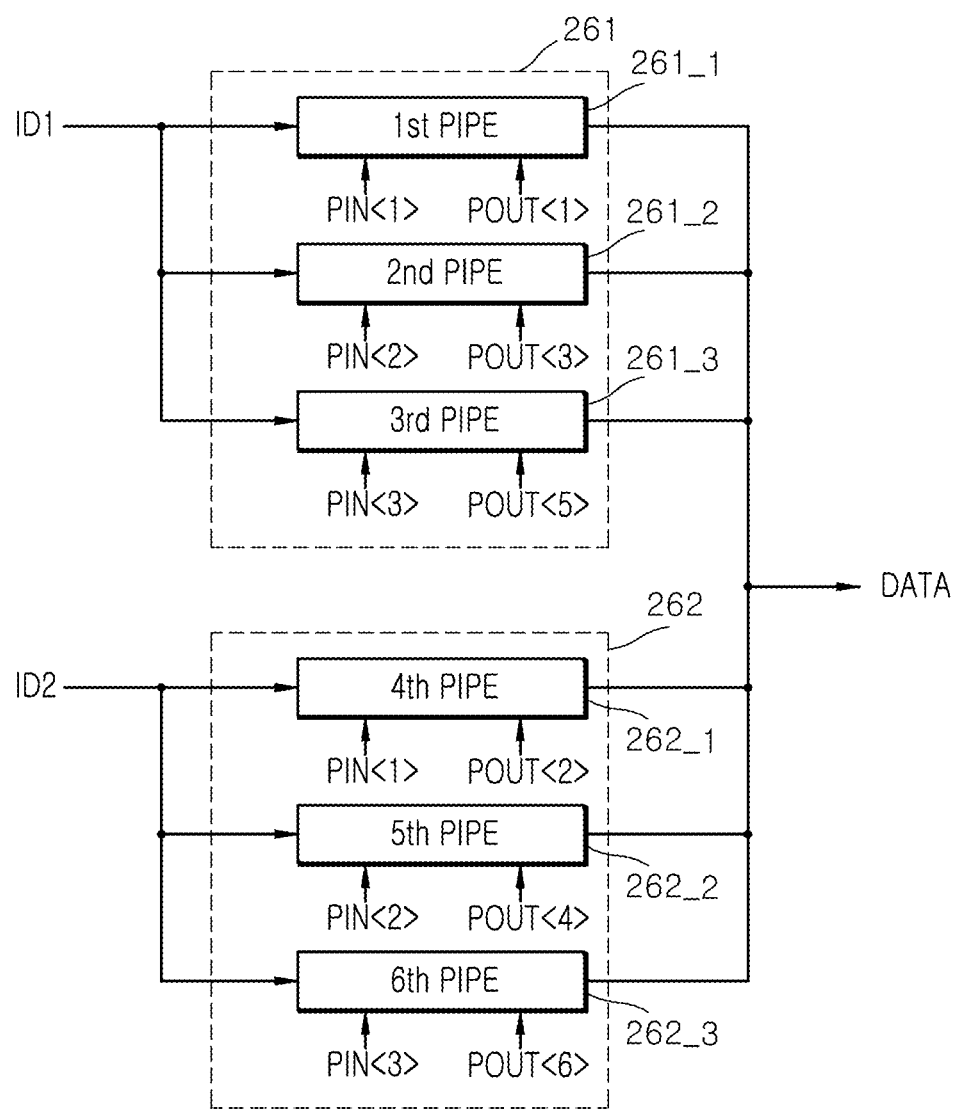
FIG. 9 is a block diagram illustrating a configuration of a data input/output circuit included in the data input/output device shown in FIG. 2, according to an embodiment of the present disclosure.

FIG. 9 is a block diagram illustrating a configuration of the data input/output circuit 260 included in the data input/output device 20 shown in FIG. 2, according to an embodiment of the present disclosure. The data input/output circuit 260 may include a first data input/output circuit 261 and a second data input/output circuit 262.

The first data input/output circuit 261 may include a first pipe circuit 261_1, a second pipe circuit 261_2, and a third pipe circuit 261_3. The first pipe circuit 261_1 may be synchronized with the first input control signal PIN<1> to latch a first bit of the first internal data ID1. The first pipe circuit 261_1 may output the latched first bit of the first internal data ID1 as a first bit of the data DATA in synchronization with the first output control signal POUT<1>. The second pipe circuit 261_2 may be synchronized with the second input control signal PIN<2> to latch a second bit of the first internal data ID1. The second pipe circuit 261_2 may output the latched second bit of the first internal data ID1 as a third bit of the data DATA in synchronization with the third output control signal POUT<3>. The third pipe circuit 261_3 may be synchronized with the third input control signal PIN<3> to latch a third bit of the first internal data ID1. The third pipe circuit 261_3 may output the latched third bit of the first internal data ID1 as a fifth bit of the data DATA in synchronization with the fifth output control signal POUT<5>. The first data input/output circuit 261 is implemented to include three pipe circuits, but may be implemented to include various numbers of pipe circuits according to embodiments.

The second data input/output circuit 262 may include a fourth pipe circuit 262_1, a fifth pipe circuit 262_2, and a sixth pipe circuit 262_3. The fourth pipe circuit 262_1 may be synchronized with the first input control signal PIN<1> to latch a first bit of the second internal data ID2. The fourth pipe circuit 262_1 may output the latched first bit of the second internal data ID1 as a second bit of the data DATA in synchronization with the second output control signal POUT<2>. The fifth pipe circuit 262_2 may be synchronized with the second input control signal PIN<2> to latch a second bit of the second internal data ID2. The fifth pipe circuit 262_2 may output the latched second bit of the second internal data ID2 as a fourth bit of the data DATA in synchronization with the fourth output control signal POUT<4>. The sixth pipe circuit 262_3 may be synchronized with the third input control signal PIN<3> to latch a third bit of the second internal data ID2. The sixth pipe circuit 262_3 may output the latched third bit of the second internal data ID2 as a sixth bit of the data DATA in synchronization with the sixth output control signal POUT<6>. The second data input/output circuit 262 is implemented to include three pipe circuits, but may be implemented to include various numbers of pipe circuits according to embodiments.

Figure 10:
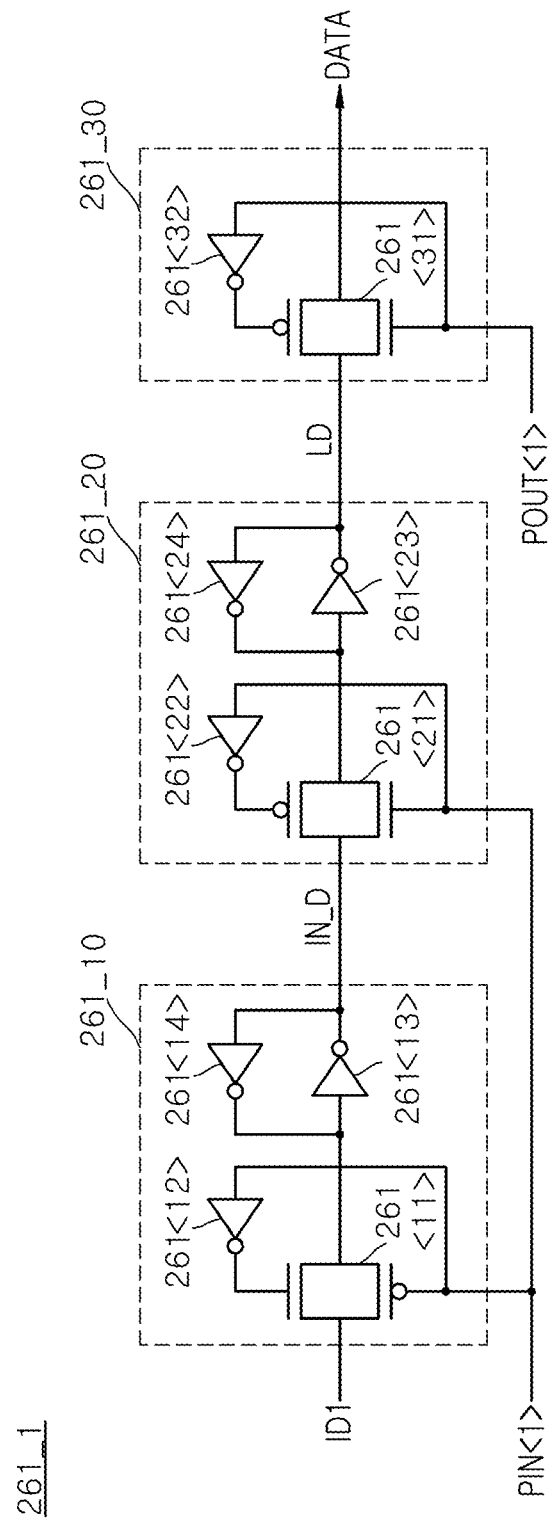
FIG. 10 is a circuit diagram illustrating a configuration of a first pipe circuit included in the data input/output circuit shown in FIG. 9, according to an embodiment of the present disclosure.

FIG. 10 is a circuit diagram illustrating a configuration of the first pipe circuit 261_1 included in the data input/output circuit 261 shown in FIG. 9, according to an embodiment of the present disclosure. The first pipe circuit 261_1 may include an input data generation circuit 261_10, a latch data generation circuit 261_20, and a data output circuit 261_30.

The input data generation circuit 261_10 may be implemented with a transfer gate 261<11> and inverters 261<12>, 261<13>, and 261<14>. The inverter 261<12> may invert the first input control signal PIN<1> to output an inverted first input control signal. The transfer gate 261<11> may receive the first internal data ID1 during a period in which the first input control signal PIN<1> is disabled at a logic "low" level. The inverters 261<13> and 261<14> may latch the first internal data ID1, and invert the latched first internal data ID1 to generate input data IN_D.

The latch data generation circuit 261_20 may be implemented with a transfer gate 261<21> and inverters 261<22>, 261<23>, and 261<24>. The inverter 261<22> may invert the first input control signal PIN<1> to output the inverted first input control signal. The transfer gate 261<21> may receive the input data IN_D during a period in which the first input control signal PIN<1> is enabled at a logic "high" level. The inverters 261<23> and 261<24> may latch the input data IN_D, and invert the latched input data IN_D to generate latch data LD.

The data output circuit 261_30 may be implemented with a transfer gate 261<31> and an inverter 261<32>. The inverter 261<32> may invert the first output control signal POUT<1> to output an inverted first output control signal.

The transfer gate 261<31> may output the latch data LD as the data DATA during a period in which the first output control signal POUT<1> is enabled at a logic "high" level.

Since each of the second to sixth pipe circuits 261_2, 261_3, 262_1, 262_2, and 262_3 shown in FIG. 9 is implemented with the same circuit and performs the same operation as the first pipe circuit 261_1 shown in FIG. 10 except for the input/output signals, detailed descriptions thereof will be omitted.

Figure 11:
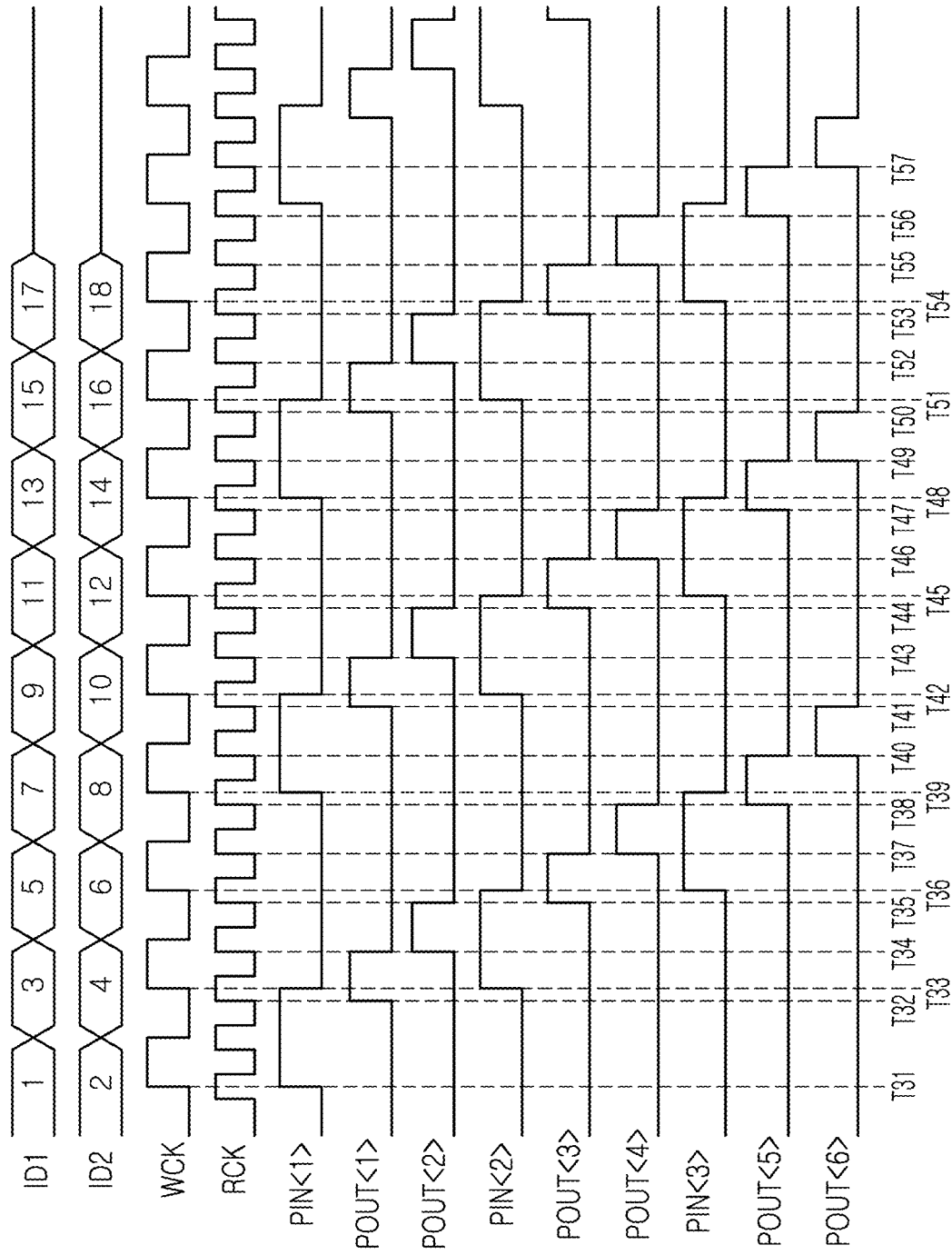
FIGS. 11 and 12 are timing diagrams illustrating an operation of a data input/output device according to an embodiment of the present disclosure.
Figure 12:
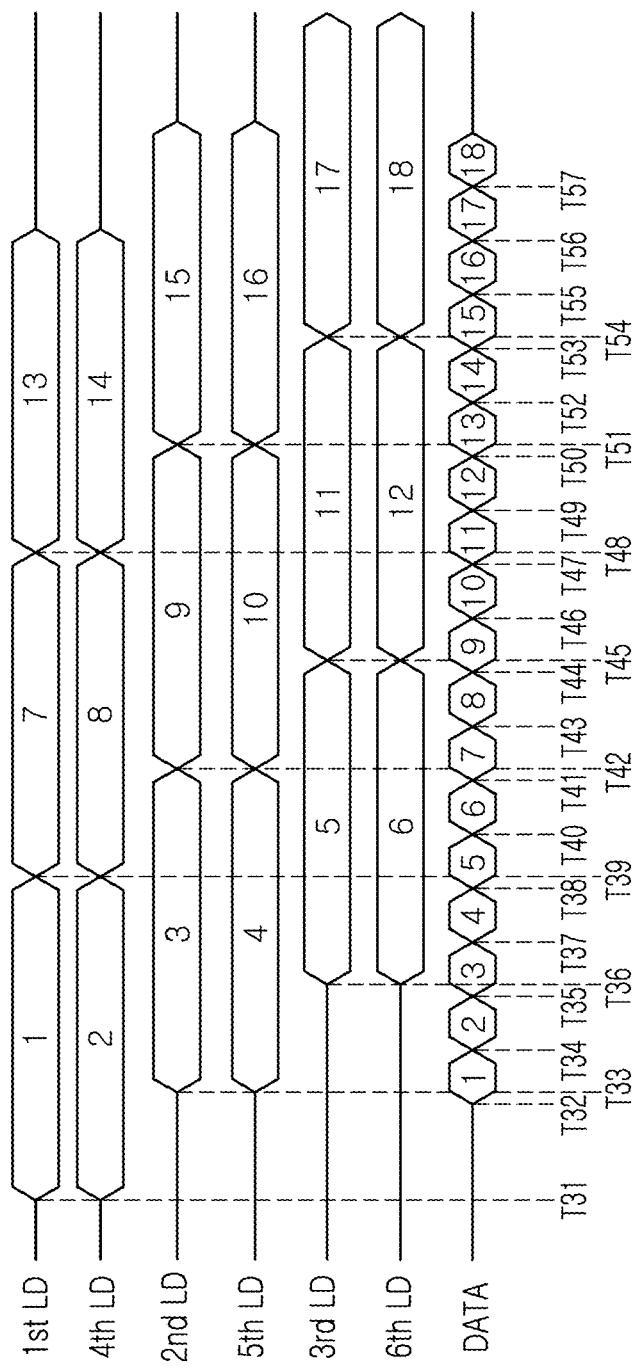

FIGS. 11 and 12 are timing diagrams illustrating an operation of the data input/output device 20 according to an embodiment of the present disclosure. The operation of the data input/output device 20 will be described with reference to FIGS. 11 and 12, together with FIGS. 4 to 7, 9 and 10, but an operation of generating data DATA by performing a domain crossing operation in the first mode (2:1 MODE) and serializing first internal data ID1 and second internal data ID2, which are parallel data, will be described as follows.

Prior to the description, as shown in FIG. 3, in the first mode (2:1 MODE), the write clock WCK may be generated to have a frequency ½ times that of the clock CLK, ½×FREQ, and the read clock RCK may be generated to have a frequency twice that of the write clock WCK, 2×FREQ.

At the time of T31, the input control signal generation circuit 251 may generate the first input control signal PIN<1> that is enabled at a logic "high" level when the write clock WCK is input for the first time.

The first pipe circuit 261_1 may latch the first bit ID1<1> of the first internal data in synchronization with the first input control signal PIN<1> of a logic "high" level to generate first latch data $1^{st}$ LD. The fourth pipe circuit 262_1 may latch the first bit ID2<1> of the second internal data in synchronization with the first input control signal PIN<1> of a logic "high" level to generate fourth latch data $4^{th}$ LD.

At the time of T32, the output control signal generation circuit 252 may perform the domain crossing operation by latching the write clock WCK at the falling edge of the read clock RCK when the selection signal SEL is enabled, and generate the first output control signal POUT<1> that is enabled at a logic "high" level in synchronization with the read clock RCK.

The first pipe circuit 261_1 may be synchronized with the first output control signal POUT<1> of a logic "high" level to output the first latch data $1^{st}$ LD generated by latching the first bit ID1<1> of the first internal data as a first bit DATA<1> of the data.

At the time of T33, the input control signal generation circuit 251 may generate the second input control signal PIN<2> that is enabled at a logic "high" level when the write clock WCK is input for the second time.

The second pipe circuit 261_2 may latch the second bit ID1<3> of the first internal data in synchronization with the second input control signal PIN<2> of a logic "high" level to generate second latch data $2^{nd}$ LD. The fifth pipe circuit 262_2 may latch the second bit ID2<4> of the second internal data in synchronization with the second input control signal PIN<2> of a logic "high" level to generate fifth latch data $5^{th}$ LD.

At the time of T34, the output control signal generation circuit 252 may generate the second output control signal POUT<2> that is enabled at a logic "high" level in synchronization with the read clock RCK.

The fourth pipe circuit 262_1 may be synchronized with the second output control signal POUT<2> of a logic "high" level to output the fourth latch data $4^{th}$ LD generated by latching the first bit ID2<2> of the second internal data as a second bit DATA<2> of the data.

At the time of T35, the output control signal generation circuit 252 may perform the domain crossing operation by latching the write clock WCK at the falling edge of the read clock RCK when the selection signal SEL is enabled, and generate the third output control signal POUT<3> that is enabled at a logic "high" level in synchronization with the read clock RCK.

The second pipe circuit 261_2 may be synchronized with the third output control signal POUT<3> of a logic "high" level to output the second latch data $2^{nd}$ LD generated by latching the second bit ID1<3> of the first internal data as a third bit DATA<1> of the data.

At the time of T36, the input control signal generation circuit 251 may generate the third input control signal PIN<3> that is enabled at a logic "high" level when the write clock WCK is input for the third time.

The third pipe circuit 261_3 may latch the third bit ID1<5> of the first internal data in synchronization with the third input control signal PIN<3> of a logic "high" level to generate third latch data $3^{rd}$ LD. The sixth pipe circuit 262_3 may latch the third bit ID2<6> of the second internal data in synchronization with the third input control signal PIN<3> of a logic "high" level to generate sixth latch data $6^{th}$ LD.

At the time of T37, the output control signal generation circuit 252 may generate the fourth output control signal POUT<4> that is enabled at a logic "high" level in synchronization with the read clock RCK.

The fifth pipe circuit 262_2 may be synchronized with the fourth output control signal POUT<4> of a logic "high" level to output the fifth latch data $5^{th}$ LD generated by latching the second bit ID2<4> of the second internal data as a fourth bit DATA<4> of the data.

At the time of T38, the output control signal generation circuit 252 may perform the domain crossing operation by latching the write clock WCK at the falling edge of the read clock RCK when the selection signal SEL is enabled, and generate the fifth output control signal POUT<5> that is enabled at a logic "high" level in synchronization with the read clock RCK.

The third pipe circuit 261_3 may be synchronized with the fifth output control signal POUT<5> of a logic "high" level to output the third latch data $3^{rd}$ LD generated by latching the third bit ID1<5> of the first internal data as a fifth bit DATA<5> of the data.

At the time of T39, the input control signal generation circuit 251 may generate the first input control signal PIN<1> that is enabled at a logic "high" level when the write clock WCK is input for the fourth time.

The first pipe circuit 261_1 may latch the fourth bit ID1<7> of the first internal data in synchronization with the first input control signal PIN<1> of a logic "high" level to generate the first latch data $1^{st}$ LD. The fourth pipe circuit 262_1 may latch the fourth bit ID2<8> of the second internal data in synchronization with the first input control signal PIN<1> of a logic "high" level to generate the fourth latch data $4^{th}$ LD.

At the time of T40, the output control signal generation circuit 252 may generate the sixth output control signal POUT<6> that is enabled at a logic "high" level in synchronization with the read clock RCK.

The sixth pipe circuit 262_3 may be synchronized with the sixth output control signal POUT<6> of a logic "high" level to output the sixth latch data $6^{th}$ LD generated by latching the third bit ID2<6> of the second internal data as a sixth bit DATA<6> of the data.

At the time of T41, the output control signal generation circuit 252 may perform the domain crossing operation by latching the write clock WCK at the falling edge of the read clock RCK when the selection signal SEL is enabled, and generate the first output control signal POUT<1> that is enabled at a logic "high" level in synchronization with the read clock RCK.

The first pipe circuit 261_1 may be synchronized with the first output control signal POUT<1> of a logic "high" level to output the first latch data $1^{st}$ LD generated by latching the fourth bit ID1<7> of the first internal data as a seventh bit DATA<7> of the data.

At the time of T42, the input control signal generation circuit 251 may generate the second input control signal PIN<2> that is enabled at a logic "high" level when the write clock WCK is input for the fifth time.

The second pipe circuit 261_2 may latch the fifth bit ID1<9> of the first internal data in synchronization with the second input control signal PIN<2> of a logic "high" level to generate the second latch data $2^{nd}$ LD. The fifth pipe circuit 262_2 may latch the fifth bit ID2<10> of the second internal data in synchronization with the second input control signal PIN<2> of a logic "high" level to generate the fifth latch data $5^{th}$ LD.

At the time of T43, the output control signal generation circuit 252 may generate the second output control signal POUT<2> that is enabled at a logic "high" level in synchronization with the read clock RCK.

The fourth pipe circuit 262_1 may be synchronized with the second output control signal POUT<2> of a logic "high" level to output the fourth latch data $4^{th}$ LD generated by latching the fourth bit ID2<8> of the second internal data as an eighth bit DATA<8> of the data.

At the time of T44, the output control signal generation circuit 252 may perform the domain crossing operation by latching the write clock WCK at the falling edge of the read clock RCK when the selection signal SEL is enabled, and generate the third output control signal POUT<3> that is enabled at a logic "high" level in synchronization with the read clock RCK.

The second pipe circuit 261_2 may be synchronized with the third output control signal POUT<3> of a logic "high" level to output the second latch data $2^{nd}$ LD generated by latching the fifth bit ID1<9> of the first internal data as a ninth bit DATA<9> of the data.

At the time of T45, the input control signal generation circuit 251 may generate the third input control signal PIN<3> that is enabled at a logic "high" level when the write clock WCK is input for the sixth time.

The third pipe circuit 261_3 may latch the sixth bit ID1<11> of the first internal data in synchronization with the third input control signal PIN<3> of a logic "high" level to generate the third latch data $3^{rd}$ LD. The sixth pipe circuit 262_3 may latch the sixth bit ID2<12> of the second internal data in synchronization with the third input control signal PIN<3> of a logic "high" level to generate the sixth latch data $6^{th}$ LD.

At the time of T46, the output control signal generation circuit 252 may generate the fourth output control signal POUT<4> that is enabled at a logic "high" level in synchronization with the read clock RCK.

The fifth pipe circuit 262_2 may be synchronized with the fourth output control signal POUT<4> of a logic "high" level to output the fifth latch data $5^{th}$ LD generated by latching the fifth bit ID2<10> of the second internal data as a tenth bit DATA<10> of the data.

At the time of T47, the output control signal generation circuit 252 may perform the domain crossing operation by latching the write clock WCK at the falling edge of the read clock RCK when the selection signal SEL is enabled, and generate the fifth output control signal POUT<5> that is enabled at a logic "high" level in synchronization with the read clock RCK.

The third pipe circuit 261_3 may be synchronized with the fifth output control signal POUT<5> of a logic "high" level to output the third latch data $3^{rd}$ LD generated by latching the sixth bit ID1<11> of the first internal data as an eleventh bit DATA<11> of the data.

At the time of T48, the input control signal generation circuit 251 may generate the first input control signal PIN<1> that is enabled at a logic "high" level when the write clock WCK is input for the seventh time.

The first pipe circuit 261_1 may latch the seventh bit ID1<13> of the first internal data in synchronization with the first input control signal PIN<1> of a logic "high" level to generate the first latch data $1^{st}$ LD. The fourth pipe circuit 262_1 may latch the seventh bit ID2<14> of the second internal data in synchronization with the first input control signal PIN<1> of a logic "high" level to generate the fourth latch data $4^{th}$ LD.

At the time of T49, the output control signal generation circuit 252 may generate the sixth output control signal POUT<6> that is enabled at a logic "high" level in synchronization with the read clock RCK.

The sixth pipe circuit 262_3 may be synchronized with the sixth output control signal POUT<6> of a logic "high" level to output the sixth latch data $6^{th}$ LD generated by latching the sixth bit ID2<12> of the second internal data as a twelfth bit DATA<12> of the data.

At the time of T50, the output control signal generation circuit 252 may perform the domain crossing operation by latching the write clock WCK at the falling edge of the read clock RCK when the selection signal SEL is enabled, and generate the fifth output control signal POUT<5> that is enabled at a logic "high" level in synchronization with the read clock RCK.

The first pipe circuit 261_1 may be synchronized with the first output control signal POUT<1> of a logic "high" level to output the first latch data $1^{st}$ LD generated by latching the seventh bit ID1<13> of the first internal data as a thirteenth bit DATA<13> of the data.

At the time of T51, the input control signal generation circuit 251 may generate the second input control signal PIN<2> that is enabled at a logic "high" level when the write clock WCK is input for the eighth time.

The second pipe circuit 261_2 may latch the eighth bit ID1<15> of the first internal data in synchronization with the second input control signal PIN<2> of a logic "high" level to generate the second latch data $2^{nd}$ LD. The fifth pipe circuit 262_2 may latch the eighth bit ID2<16> of the second internal data in synchronization with the second input control signal PIN<2> of a logic "high" level to generate the fifth latch data $5^{th}$ LD.

At the time of T52, the output control signal generation circuit 252 may generate the second output control signal POUT<2> that is enabled at a logic "high" level in synchronization with the read clock RCK.

The fourth pipe circuit 262_1 may be synchronized with the second output control signal POUT<2> of a logic "high" level to output the fourth latch data $4^{th}$ LD generated by latching the seventh bit ID2<14> of the second internal data as a fourteenth bit DATA<14> of the data.

At the time of T53, the output control signal generation circuit 252 may perform the domain crossing operation by latching the write clock WCK at the falling edge of the read clock RCK when the selection signal SEL is enabled, and generate the third output control signal POUT<3> that is enabled at a logic "high" level in synchronization with the read clock RCK.

The second pipe circuit 261_2 may be synchronized with the third output control signal POUT<3> of a logic "high" level to output the second latch data $2^{nd}$ LD generated by latching the eighth bit ID1<15> of the first internal data as a fifteenth bit DATA<15> of the data.

At the time of T54, the input control signal generation circuit 251 may generate the third input control signal PIN<3> that is enabled at a logic "high" level when the write clock WCK is input for the ninth time.

The third pipe circuit 261_3 may latch the ninth bit ID1<17> of the first internal data in synchronization with the third input control signal PIN<3> of a logic "high" level to generate the third latch data $3^{rd}$ LD. The sixth pipe circuit 262_3 may latch the ninth bit ID2<18> of the second internal data in synchronization with the third input control signal PIN<3> of a logic "high" level to generate the sixth latch data $6^{th}$ LD.

At the time of T55, the output control signal generation circuit 252 may generate the fourth output control signal POUT<4> that is enabled at a logic "high" level in synchronization with the read clock RCK.

The fifth pipe circuit 262_2 may be synchronized with the fourth output control signal POUT<4> of a logic "high" level to output the fifth latch data $5^{th}$ LD generated by latching the eighth bit ID2<16> of the second internal data as a sixteenth bit DATA<16> of the data.

At the time of T56, the output control signal generation circuit 252 may perform the domain crossing operation by latching the write clock WCK at the falling edge of the read clock RCK when the selection signal SEL is enabled, and generate the fifth output control signal POUT<5> that is enabled at a logic "high" level in synchronization with the read clock RCK.

The third pipe circuit 261_3 may be synchronized with the fifth output control signal POUT<5> of a logic "high" level to output the third latch data $3^{rd}$ LD generated by latching the ninth bit ID1<17> of the first internal data as a seventeenth bit DATA<17> of the data.

At the time of T57, the output control signal generation circuit 252 may generate the sixth output control signal POUT<6> that is enabled at a logic "high" level in synchronization with the read clock RCK.

The sixth pipe circuit 262_3 may be synchronized with the sixth output control signal POUT<6> of a logic "high" level to output the sixth latch data $6^{th}$ LD generated by latching the ninth bit ID2<18> of the second internal data as an eighteenth bit DATA<18> of the data.

The above-described data input/output device 20 may perform the domain crossing operation converting a low-frequency write clock into a high-frequency read clock, convert parallel data into serial data, and output the converted data. The data input/output device 20 may be synchronized with the read clock having a frequency twice higher than that of the write clock, and serialize parallel data during one period of the write clock to continuously output 2-bit serial data.

Figure 13:
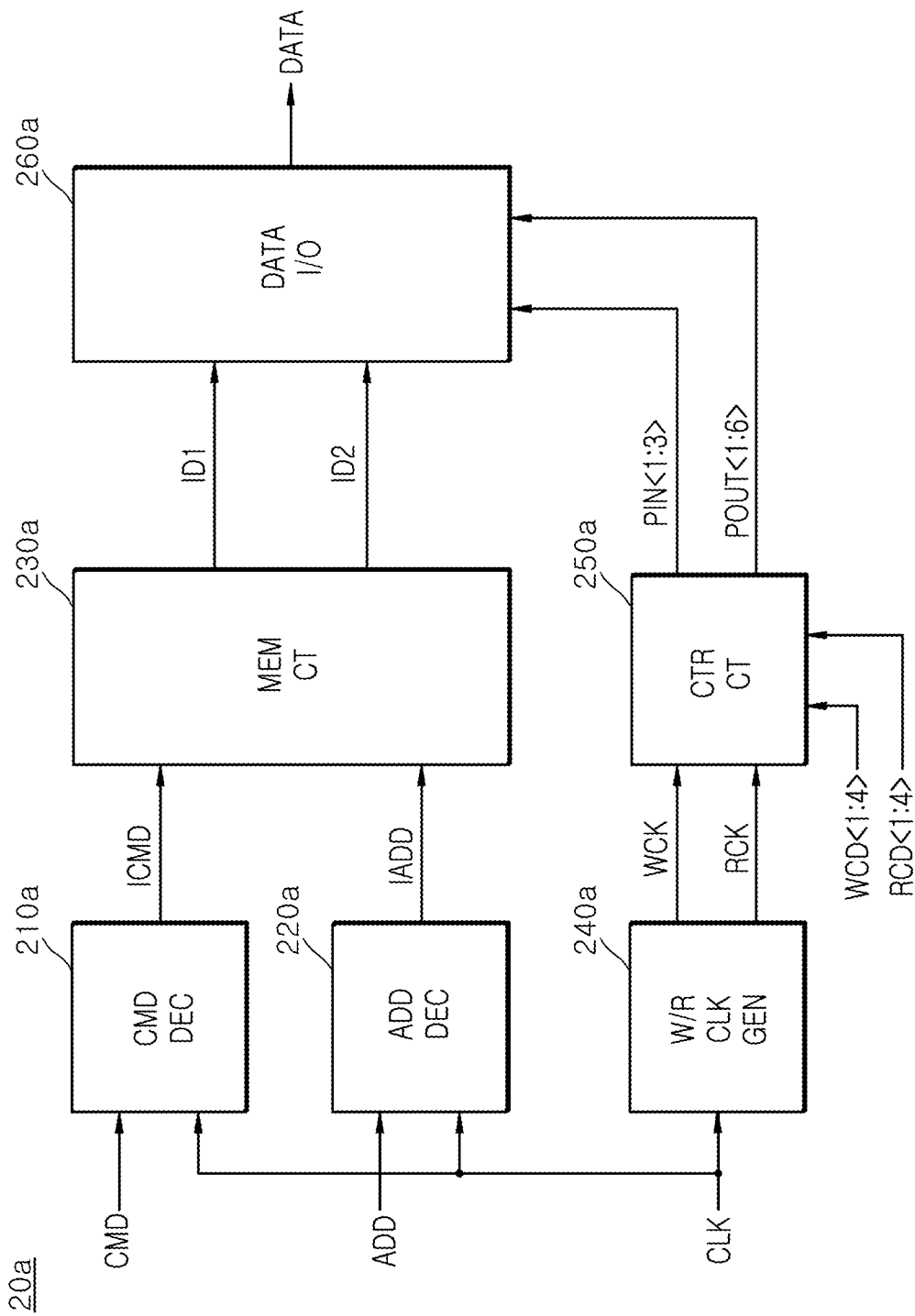
FIG. 13 is a block diagram illustrating a configuration of a data input/output device included in a system according to another embodiment of the present disclosure.

FIG. 13 is a block diagram illustrating a configuration of a data input/output device 20a included in the system 1, according to another embodiment of the present disclosure.

As shown in FIG. 13, the data input/output device 20a may include a command decoder 210a, an address decoder 220a, a memory circuit 230a, a write/read clock generation circuit 240a, a control circuit 250a, and a data input/output circuit 260a.

The command decoder 210a, the address decoder 220a, the memory circuit 230a, the write/read clock generation circuit 240a, and the data input/output circuit 260a shown in FIG. 13 may be implemented with the same circuits and perform the same operations as the command decoder 210, the address decoder 220, the memory circuit 230, the write/read clock generation circuit 240, and the data input/output circuit 260 shown in FIG. 2. Accordingly, detailed descriptions will be omitted.

The control circuit 250a may be synchronized with a write clock WCK to generate first to third input control signals PIN<1:3>. The control circuit 250a may generate the first to third input control signals PIN<1:3> that are sequentially enabled whenever the write clock WCK is input. For example, the control circuit 250a may generate the first input control signal PIN<1> when the write clock WCK is input, and generate the second input control signal PIN<2> when the write clock WCK is input again. The control circuit 250a may generate the first input control signal PIN<1> after generating the third input control signal PIN<3>. The control circuit 250a may perform a domain crossing operation of converting the write clock WCK into a read clock RCK. The control circuit 250a may delay the write clock WCK by a delay amount set by a write code WCD<1:4>. The control circuit 250a may delay the read clock RCK by a delay amount set by a read code RCD<1:4>. The control circuit 250a may perform the domain crossing operation by delaying the write clock WCK and the read clock RCK by the delay amounts set by the write code WCD<1:4> and the read code RCD<1:4>, respectively. The control circuit 250a may perform the domain crossing operation by latching the delayed write clock WCK at a rising edge of the delayed read clock RCK. The write code WCD<1:4> and the read code RCD<1:4> may be set as signals stored in a mode register set (MRS) and output. The write code WCD<1:4> and the read code RCD<1:4> may be set in various logic level combinations for setting the delay amounts so that a pulse of the write clock WCK is generated at the rising edge of the read clock RCK. The control circuit 250a may perform the domain crossing operation to generate first to sixth output control signals POUT<1:6>. The control circuit 250a may perform the domain crossing operation and generate the first to sixth output control signals POUT<1:6> that are sequentially enabled in synchronization with the read clock RCK. For example, the control circuit 250a may perform the domain crossing operation, generate the first output control signal POUT<1> when the read clock RCK is input, and generate the second output control signal POUT<2> when the read clock RCK is input again. The control circuit 250a may generate the first output control signal POUT<1> when the read clock RCK is input after generating the sixth output control signal POUT<6>.

Figure 14:
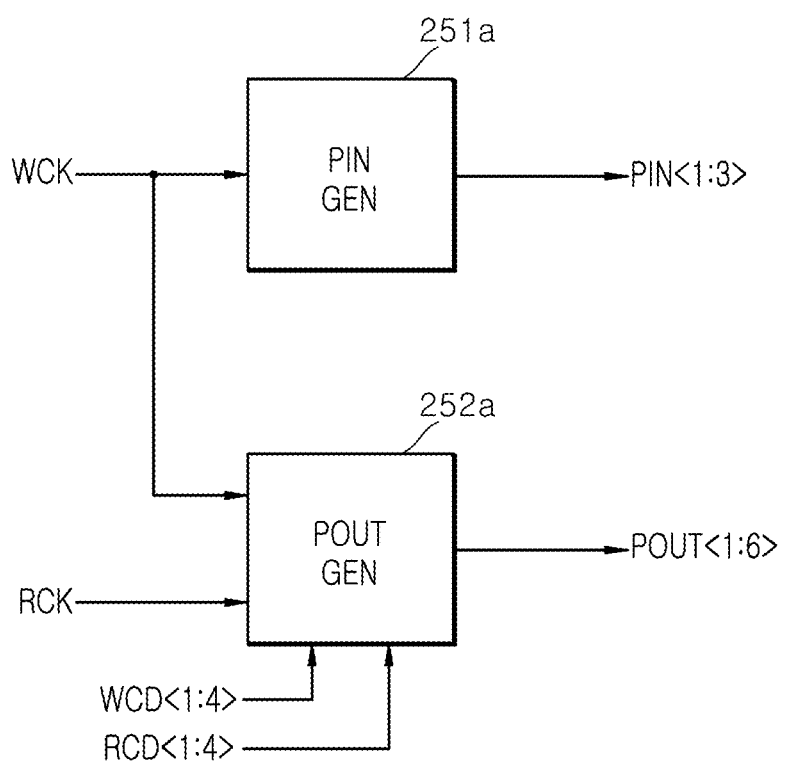
FIG. 14 is a block diagram illustrating a configuration of a control circuit included in the data input/output device shown in FIG. 13, according to an embodiment of the present disclosure.

FIG. 14 is a block diagram illustrating a configuration of the control circuit 250a included in the data input/output device 20a shown in FIG. 13, according to an embodiment of the present disclosure. The control circuit 250a may include an input control signal generation circuit 251a and an output control signal generation circuit 252a.

Since the input control signal generation circuit 251a may be implemented with the same circuit and perform the same operation as the input control signal generation circuit 251 shown in FIGS. 4 and 5, a detailed description thereof will be omitted.

The output control signal generation circuit 252a may delay the write clock WCK by a delay amount set by the write code WCD<1:4>. The output control signal generation circuit 252a may delay the read clock RCK by a delay amount set by the read code RCD<1:4>. The output control signal generation circuit 252a may perform the domain crossing operation by delaying the write clock WCK and the read clock RCK by the delay amounts set by the write code WCD<1:4> and the read code RCD<1:4>, respectively. The output control signal generation circuit 252a may perform the domain crossing operation by latching a delayed write clock WCK at a rising edge of a delayed read clock RCK. The output control signal generation circuit 252a may perform the domain crossing operation, and generate the first to sixth output control signals POUT<1:6> that are sequentially enabled in synchronization with the read clock RCK.

Figure 15:
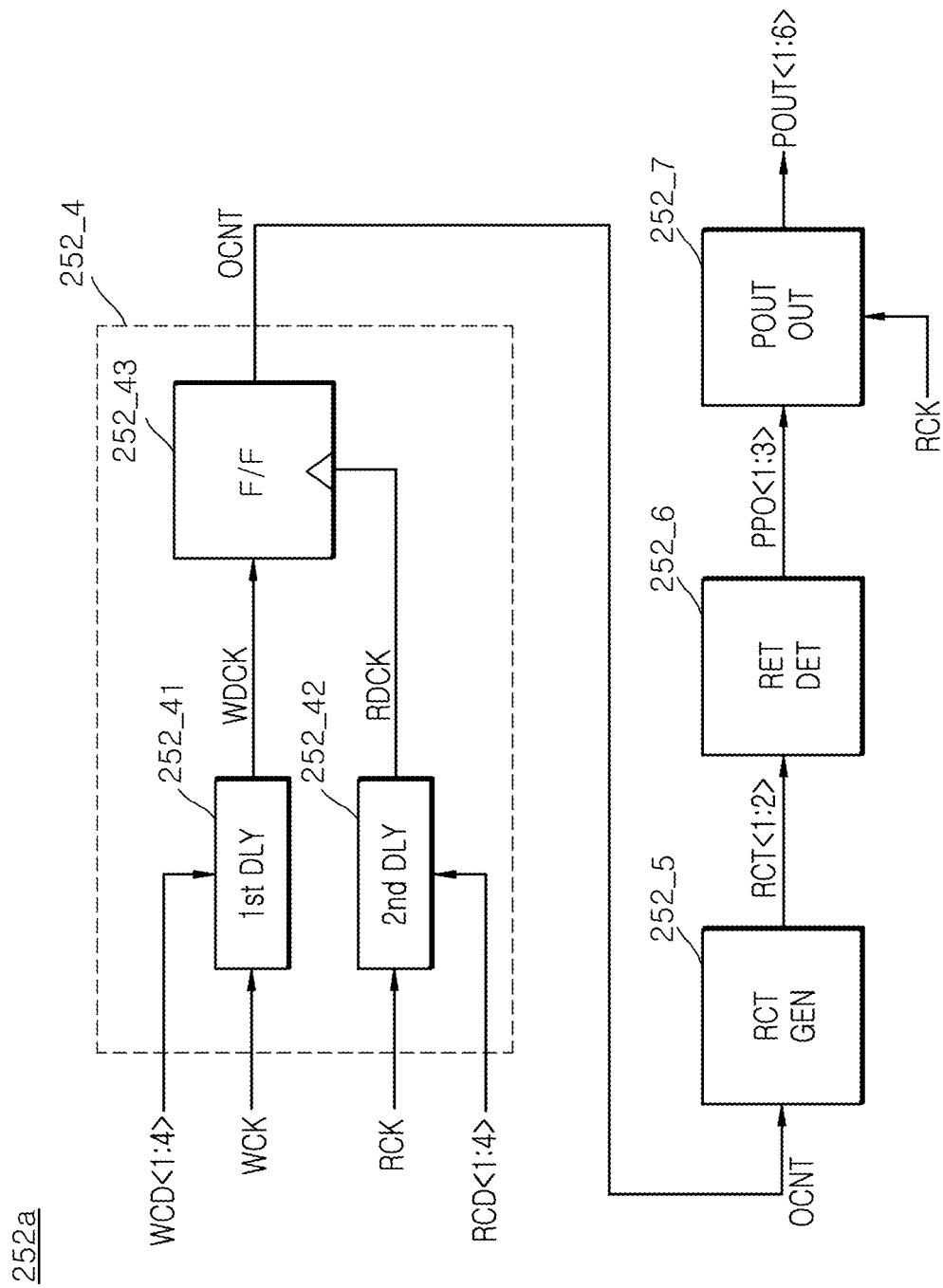
FIG. 15 is a block diagram illustrating a configuration of an output control signal generation circuit included in the control circuit shown in FIG. 14, according to an embodiment of the present disclosure.

FIG. 15 is a block diagram illustrating a configuration of the output control signal generation circuit 252a included in the control circuit 250a shown in FIG. 14, according to an embodiment of the present disclosure. The output control signal generation circuit 252a may include an output counting signal generation circuit 252_4, a read counting signal generation circuit 252_5, a read counting signal detection circuit 252_6, and an output control signal output circuit 252_7.

The output counting signal generation circuit 252_4 may be implemented with a first delay circuit 252_41, a second delay circuit 252_42, and a flip-flop 252_43. The first delay circuit 252_41 may delay the write clock WCK by a delay amount set by the write code WCD<1:4> to generate a delayed write clock WDCK. The second delay circuit 252_42 may delay the read clock RCK by a delay amount set by the read code RCD<1:4> to generate a delayed read clock RDCK. The flip-flop 252_43 may latch the delayed write clock WDCK at a rising edge of the delayed read clock RDCK to generate an output counting signal OCNT.

The output counting signal generation circuit 252_4 may delay the write clock WCK and the read clock RCK by the delay amounts set by the write code WCD<1:4 and the read code RCD<1:4> to generate the delayed write clock WDCK and the delayed read clock RDCK, respectively. The output counting signal generation circuit 252_4 may perform the domain crossing operation by latching the delayed write clock WDCK at the rising edge of the delayed read clock RDCK to generate the output counting signal OCNT.

The read counting signal generation circuit 252_5 may generate first and second read counting signals RCT<1:2> that are sequentially counted in synchronization with a falling edge of the output counting signal OCNT. The read counting signal generation circuit 252_5 may generate the first and second read counting signals RCT<1:2> that are up-counted from "10" to "00" in synchronization with the falling edge of the output counting signal OCNT when the output counting signal OCNT is input for the first time. The read counting signal generation circuit 252_5 may generate the first and second read counting signals RCT<1:2> that are up-counted from "00" to "01" in synchronization with the falling edge of the output counting signal OCNT when the output counting signal OCNT is input for the second time. The read counting signal generation circuit 252_5 may generate the first and second read counting signals RCT<1:2> that are up-counted from "01" to "10" in synchronization with the falling edge of the output counting signal OCNT when the output counting signal OCNT is input for the third time. The read counting signal generation circuit 252_5 may generate the first and second read counting signals RCT<1:2> that are up-counted from "10" to "00" in synchronization with the falling edge of the output counting signal OCNT when the output counting signal OCNT is input for the fourth time. The first and second read counting signals RCT<1:2> up-counted to "10" may mean that the first read counting signal RCT<1> is generated at a logic "high" level '1' and the second read counting signal RCT<2> is generated at a logic "low" level '0'.

The read counting signal detection circuit 252_6 may detect the logic level combination of the first and second read counting signals RCT<1:2> to generate first to third pre-output control signals PPO<1:3>. The read counting signal detection circuit 252_6 may generate the first pre-output control signal PPO<1> that is enabled when the first and second read counting signals RCT<1:2> are generated as "00". The read counting signal detection circuit 252_6 may generate the second pre-output control signal PPO<2> that is enabled when the first and second read counting signals RCT<1:2> are generated as "01". The read counting signal detection circuit 252_6 may generate the third pre-output control signal PPO<3> that is enabled when the first and second read counting signals RCT<1:2> are generated as "10".

The output control signal output circuit 252_7 may generate the first to sixth output control signals POUT<1:6> that are sequentially enabled based on the first to third pre-output control signals PPO<1:3> in synchronization with the read clock RCK. The output control signal output circuit 252_7 may generate the first and second output control signals POUT<1:2> that are sequentially enabled in synchronization with the rising edge of the read clock RCK when the first pre-output control signal PPO<1> is enabled. The output control signal output circuit 252_7 may generate the third and fourth output control signals POUT<3:4> that are sequentially enabled in synchronization with the rising edge of the read clock RCK when the second pre-output control signal PPO<2> is enabled. The output control signal output circuit 252_7 may generate the fifth and sixth output control signals POUT<5:6> that are sequentially enabled in synchronization with the rising edge of the read clock RCK when the third pre-output control signal PPO<3> is enabled.

Since the data input/output device 20a according to another embodiment of the present invention shown in FIGS. 13 to 15 may perform the same operation except for performing the domain crossing operation by latching the delayed write clock WCK at the rising edge of the delayed read clock RCK, unlike the data input/output device 20 described in FIGS. 1 to 12, a detailed description of the operation will be omitted.

The above-described data input/output device 20a may perform the domain crossing operation of converting the low-frequency write clock into the high-frequency read clock, convert parallel data into serial data, and output converted data. In the first mode (2:1 MODE), the data input/output device 20a may be synchronized with the read clock having a frequency twice that of the write clock, serialize the parallel data during one cycle of the write clock, and continuously output 2-bit serial data.

Figure 16:
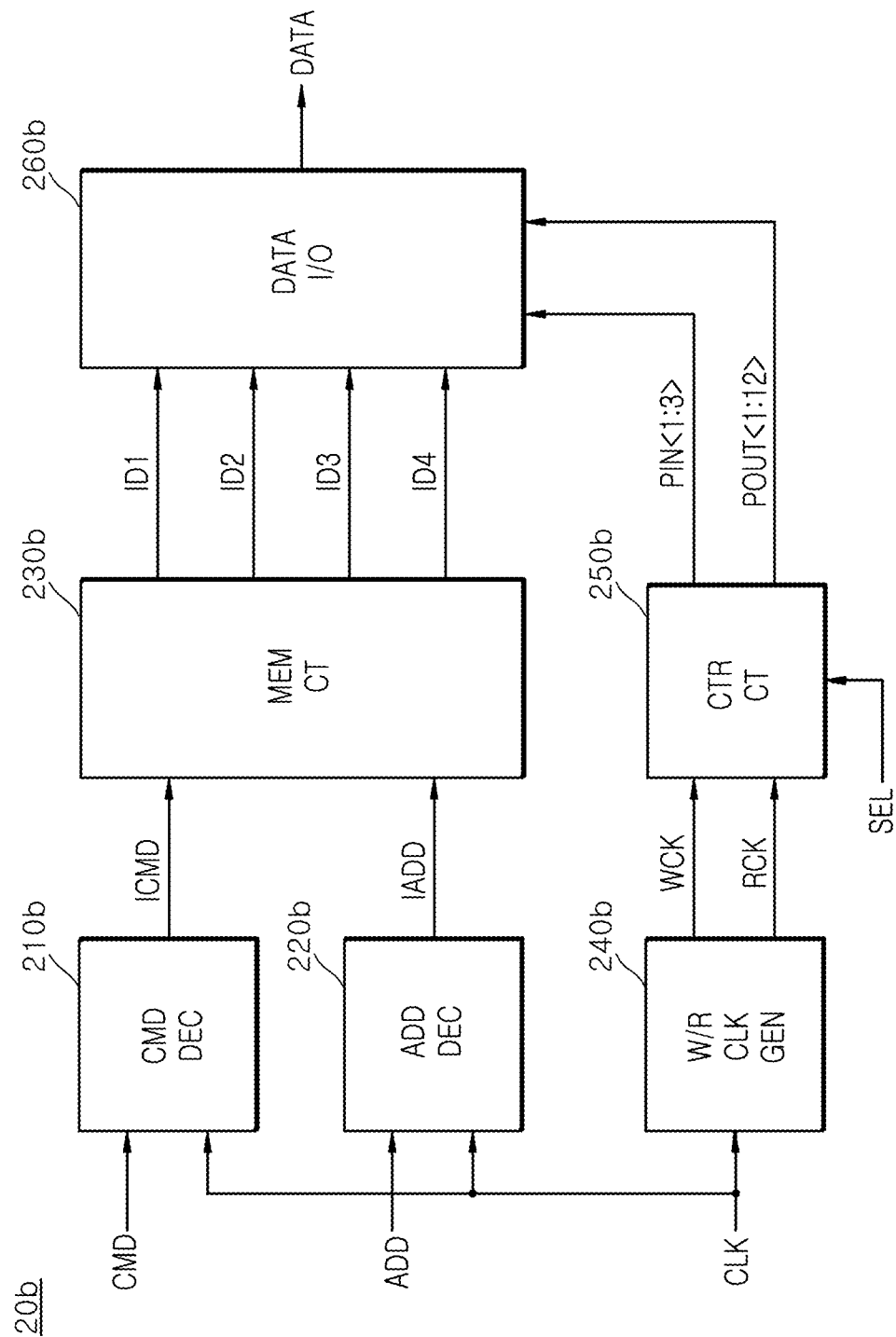
FIG. 16 is a block diagram illustrating a configuration of a data input/output device included in a system according to another embodiment of the present disclosure.

FIG. 16 is a block diagram illustrating a configuration of a data input/output device 20b included in the system 1, according to another embodiment of the present disclosure.

As shown in FIG. 16, the data input/output device 20b may include a command decoder 210b, an address decoder 220b, a memory circuit 230b, a write/read clock generation circuit 240b, a control circuit 250b, a data input/output circuit 260b.

The command decoder 210b and the address decoder 220b shown in FIG. 16 may be implemented with the same circuits and perform the same operations as the command decoder 210 and the address decoder 220 shown in FIG. 2, so that detailed descriptions will be omitted.

The memory circuit 230b may be implemented as a general memory circuit including a plurality of memory cells (not shown). During a read operation, when an internal command ICMD is input, the memory circuit 230b may output first internal data ID1, second internal data ID2, third internal data ID3, and fourth internal data ID4 stored in the memory cell (not shown) selected by an internal address IADD. Each of the first internal data ID1, the second internal data ID2, the third internal data ID3, and the fourth internal data ID4 may be set to include a plurality of bits. The first internal data ID1, the second internal data ID2, the third internal data ID3, and the fourth internal data ID4 may be set as parallel data output through different input/output lines.

The write/read clock generation circuit 240b may receive a clock CLK to generate a write clock WCK and a read clock RCK. The write/read clock generation circuit 240b may generate the write clock WCK having a frequency ¼ times that of the clock CLK. The write/read clock generation circuit 240b may generate the read clock RCK having a frequency four times that of the write clock WCK. The write/read clock generation circuit 240b may generate the write clock WCK that is periodically toggled in the second mode (4:1 MODE) and the read clock RCK that is periodically toggled with a frequency four times that of the write clock WCK. The write clock WCK and the read clock RCK may be generated to have different phases. The write clock WCK and the read clock RCK generated in the write/read clock generation circuit 240b will be described in more detail with reference to FIG. 17 to be described later. According to embodiments, the read clock RCK may be generated as a signal having a frequency 2N times that of the write clock WCK. For example, the read clock RCK may be generated as a signal having various frequencies, such as 2 times, 4 times, 8 times, or 16 times the write clock WCK. Here, "N" may be set to a positive integer.

The control circuit 250b may generate first to third input control signals PIN<1:3> in synchronization with the write clock WCK. The control circuit 250b may generate the first to third input control signals PIN<1:3> that are sequentially enabled whenever the write clock WCK is input. For example, the control circuit 250b may generate the first input control signal PIN<1> when the write clock WCK is input, and generate the second input control signal PIN<2> when the write clock WCK is input again. The control circuit 250b may generate the first input control signal PIN<1> when the write clock WCK is input after generating the third input control signal PIN<3>. The control circuit 250b may perform the domain crossing operation of converting the write clock WCK into the read clock RCK. The control circuit 250b may perform the domain crossing of latching the write clock WCK at a rising edge or a falling edge of the read clock RCK by a selection signal SEL. The selection signal SEL may be set as a signal that is enabled when a pulse of the write clock WCK is generated at the falling edge of an odd-numbered pulse of the read clock RCK, and disabled when the pulse of the write clock WCK is not generated at the falling edge of the odd-numbered pulse of the read clock RCK. The control circuit 250b may perform the domain crossing operation to generate first to twelfth output control signals POUT<1:12>. The control circuit 250b may perform the domain crossing operation, and generate the first to twelfth output control signals POUT<1:12> that are sequentially enabled in synchronization with the read clock RCK. For example, the control circuit 250b may perform the domain crossing operation, generate the first output control signal POUT<1> when the read clock RCK is input, and generate the second output control signal POUT<2> when the read clock RCK is input again. The control circuit 250b may generate the first output control signal POUT<1> when the read clock RCK is input after generating the twelfth output control signal POUT<12>. According to embodiments, when the read clock RCK is generated as a signal having a frequency 4 times that of the write clock WCK, a number of the plurality of output control signals may be four times greater than a number of the plurality of input control signals. For example, when the number of the plurality of input control signals is 3, the number of the plurality of output control signals may be 12. The numbers of the plurality of input control signals and the plurality of output control signals may vary according to embodiments.

The data input/output circuit 260b may latch, in synchronization with the first to third input control signals PIN<1:3>, the first internal data ID1, the second internal data ID2, the third internal data ID3, and the fourth internal data ID4 that are input in parallel. The data input/output circuit 260b may serialize, in synchronization with the first to twelfth output control signals POUT<1:12>, the latched first internal data ID1, the second internal data ID2, the third internal data ID3, and the fourth internal data ID4 to generate data DATA. The data DATA may be set to include a plurality of bits. The data DATA may be set as a serial data that is output through one input/output line. The data DATA may be output to the controller (10 of FIG. 1) through the fourth transmission line (12_4 of FIG. 1).

Figure 17:
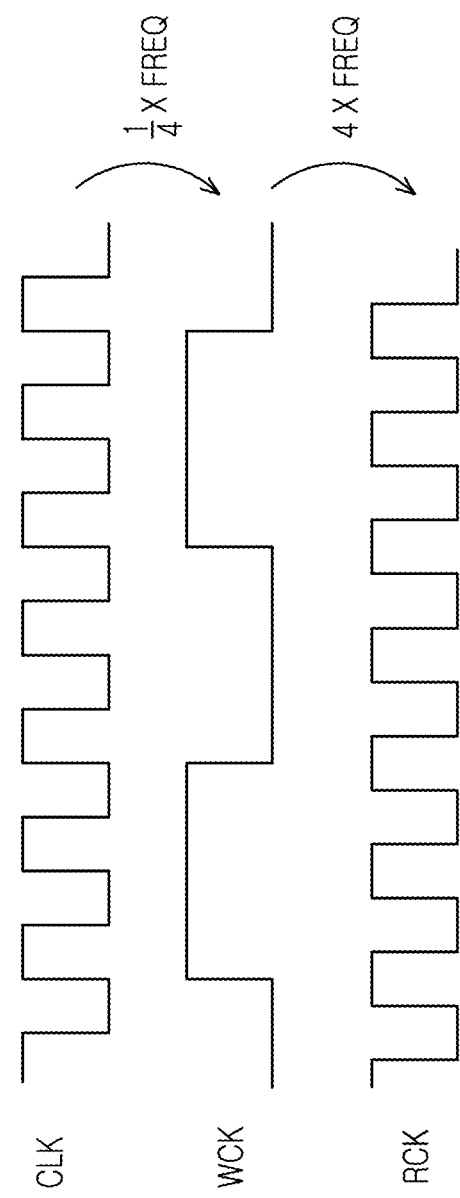
FIG. 17 is a diagram illustrating an operation of a write/read clock generation circuit included in the data input/output device shown in FIG. 16, according to an embodiment of the present disclosure.

FIG. 17 is a diagram illustrating an operation of the write/read clock generation circuit 240b included in the data input/output device 20b shown in FIG. 16, according to an embodiment of the present disclosure. The operation of the write read clock generation circuit 240b will be described with reference to FIG. 17, but the operation of generating the write clock WCK and the read clock RCK in the second mode (4:1 MODE) will be described below.

The second mode (4:1 MODE) may mean an operation in which the frequency of the read clock RCK is 4 times higher than the frequency of the write clock WCK.

The write/read clock generation circuit 240b may generate the write clock WCK having a frequency (¼×FREQ) ¼ times that of the clock CLK in the second mode (4:1 MODE). The write/read clock generation circuit 240b may generate the write clock WCK having a ¼ cycle during one cycle of the clock CLK in the second mode (4:1 MODE).

The write/read clock generation circuit 240b may generate the write clock WCK having a frequency (4×FREQ) 4 times that of the clock CLK in the second mode (4:1 MODE). The write/read clock generation circuit 240b may generate the write clock WCK having 4 cycles during one cycle of the clock CLK in the second mode (4:1 MODE).

Figure 18:
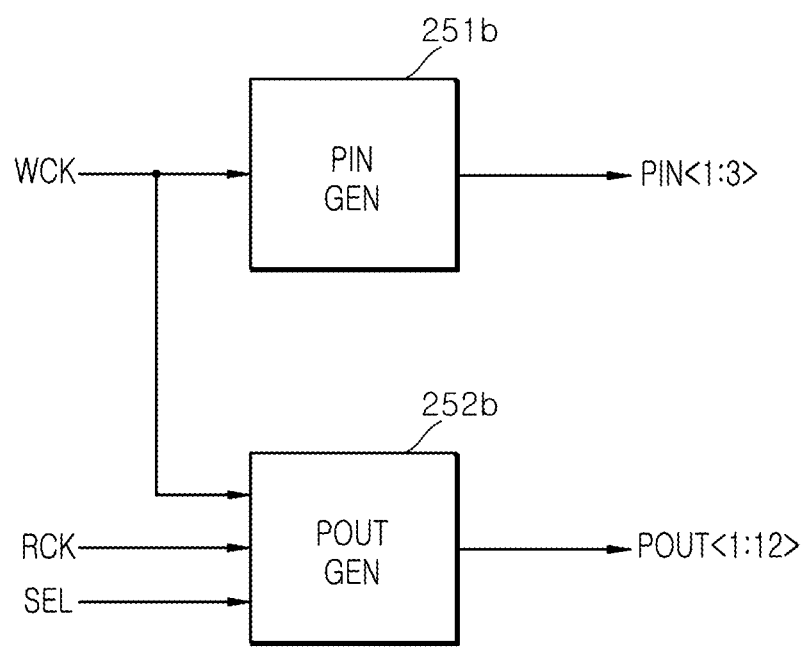
FIG. 18 is a block diagram illustrating a configuration of a control circuit included in the data input/output device shown in FIG. 16, according to an embodiment of the present disclosure.

FIG. 18 is a block diagram illustrating a configuration of the control circuit 250b included in the data input/output device 20b shown in FIG. 16, according to an embodiment of the present disclosure. The control circuit 250b may include an input control signal generation circuit 251b and an output control signal generation circuit 252b.

The input control signal generation circuit 251b may be implemented with the same circuit and perform the same operation as the input control signal generation circuit 251 shown in FIGS. 4 and 5. Accordingly, a detailed description will be omitted.

The output control signal generation circuit 252b may perform the domain crossing operation by latching the write clock WCK at the rising edge or the falling edge of the read clock RCK by the selection signal SEL. The output control signal generation circuit 252b may perform the domain crossing operation by latching the write clock WCK at the falling edge of the read clock RCK when the selection signal SEL is enabled. The output control signal generation circuit 252b may perform the domain crossing operation by latching the write clock WCK at the rising edge of the read clock RCK when the selection signal SEL is disabled. The output control signal generation circuit 252b may perform the domain crossing operation, and generate the first to twelfth output control signals POUT<1:12> that are sequentially enabled in synchronization with the read clock RCK.

Figure 19:
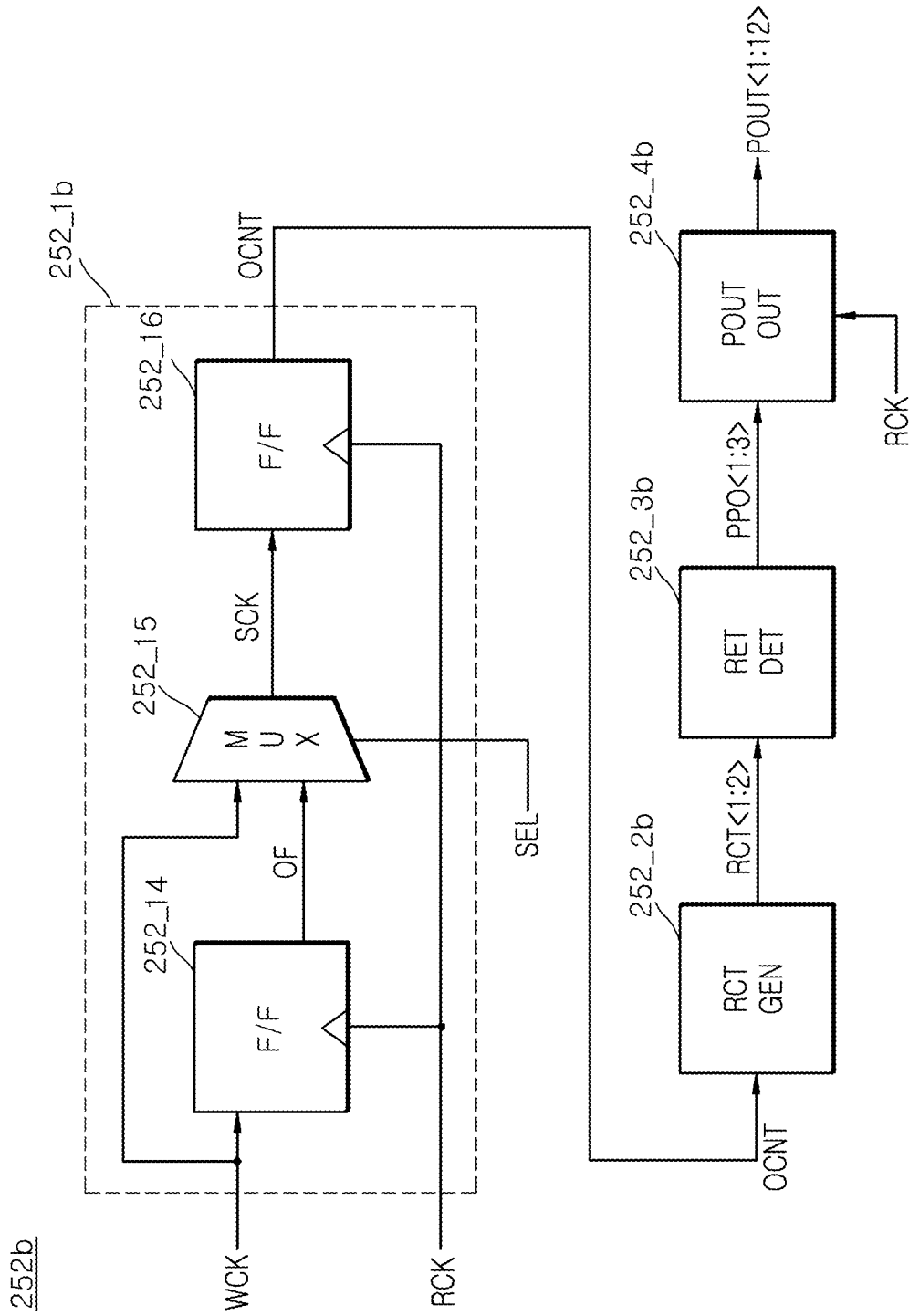
FIG. 19 is a block diagram illustrating a configuration of an output control signal generation circuit included in the control circuit shown in FIG. 18, according to an embodiment of the present disclosure.

FIG. 19 is a block diagram illustrating a configuration of the output control signal generation circuit 252b included in the control circuit 250b shown in FIG. 18, according to an embodiment of the present disclosure. The output control signal generation circuit 252b may include an output counting signal generation circuit 252_1b, a read counting signal generation circuit 252_2b, a read counting signal detection circuit 252_3b, and an output control signal output circuit 252_4b.

The output counting signal generation circuit 252_1b may be implemented with a flip-flop 252_14, a multiplexer 252_15, and a flip-flop 252_16. The flip-flop 252_14 may latch the write clock WCK at a falling edge of the read clock RCK to generate a falling detection signal OF. The multiplexer 252_15 may output the falling detection signal OF as a selection clock SCK when the selection signal SEL is enabled at a logic "high" level. The multiplexer 252_15 may output the write clock WCK as the selection clock SCK when the selection signal SEL is disabled at a logic "low" level. The flip-flop 252_16 may latch the selection clock SCK at the rising edge of the read clock RCK to generate the output counting signal OCNT.

The output counting signal generation circuit 252_1b may perform the domain crossing operation by latching the write clock WCK at the falling edge of the read clock RCK or latching the write clock WCK at the rising edge of the read clock RCK based on the selection signal SEL to generate the output counting signal OCNT. The output counting signal generation circuit 252_1b may perform the domain crossing operation by latching the write clock WCK at the falling edge of the read clock RCK to generate the output counting signal OCNT when the selection signal SEL is enabled at a logic "high" level. The output counting signal generation circuit 252_1b may perform the domain crossing operation by latching the write clock WCK at the rising edge of the read clock RCK to generate the output counting signal OCNT when the selection signal SEL is disabled at a logic "low" level.

The read counting signal generation circuit 252_2b may generate first and second read counting signals RCT<1:2> that are sequentially counted in synchronization with a falling edge of the output counting signal OCNT. The read counting signal generation circuit 252_2b may generate the first and second read counting signals RCT<1:2> that are up-counted from "10" to "00" in synchronization with the falling edge of the output counting signal OCNT when the output counting signal OCNT is input for the first time. The read counting signal generation circuit 252_2b may generate the first and second read counting signals RCT<1:2> that are up-counted from "00" to "01" in synchronization with the falling edge of the output counting signal OCNT when the output counting signal OCNT is input for the second time. The read counting signal generation circuit 252_2b may generate the first and second read counting signals RCT<1:2> that are up-counted from "01" to "10" in synchronization with the falling edge of the output counting signal OCNT when the output counting signal OCNT is input for the third time. The read counting signal generation circuit 252_2b may generate the first and second read counting signals RCT<1:2> that are up-counted from "10" to "00" in synchronization with the falling edge of the output counting signal OCNT when the output counting signal OCNT is input for the fourth time. The first and second read counting signals RCT<1:2> up-counted to "10" may mean that the first read counting signal RCT<1> is generated at a logic "high" level '1' and the second read counting signal RCT<2> is generated at a logic "low" level '0'.

The read counting signal detection circuit 252_3b may detect the logic level combination of the first and second read counting signals RCT<1:2> to generate the first to third pre-output control signals PPO<1:3>. The read counting signal detection circuit 252_3b may generate the first pre-output control signal PPO<1> that is enabled when the first and second read counting signals RCT<1:2> are generated as "00". The read counting signal detection circuit 252_3b may generate the second pre-output control signal PPO<2> that is enabled when the first and second read counting signals RCT<1:2> are generated as "01". The read counting signal detection circuit 252_3b may generate the third pre-output control signal PPO<3> that is enabled when the first and second read counting signals RCT<1:2> are generated as "10".

The output control signal output circuit 252_4b may generate the first to twelfth output control signals POUT<1:12> that are sequentially enabled based on the first to third pre-output control signals PPO<1:3> in synchronization with the read clock RCK. The output control signal output circuit 252_4b may generate the first to fourth output control signals POUT<1:4> that are sequentially enabled in synchronization with the rising edge of the read clock RCK when the first pre-output control signals PPO<1> is enabled. The output control signal output circuit 252_4b may generate the fifth to eighth output control signals POUT<5:8> that are sequentially enabled in synchronization with the rising edge of the read clock RCK when the second pre-output control signals PPO<2> is enabled. The output control signal output circuit 252_4b may generate the sixth to twelfth output control signals POUT<9:12> that are sequentially enabled in synchronization with the rising edge of the read clock RCK when the third pre-output control signals PPO<3> is enabled.

Unlike the output control signal output circuit 252_4 shown in FIG. 5, the output control signal output circuit 252_4b may be implemented to generate the first to twelfth output control signals POUT<1:12> in synchronization with the read clock RCK having a frequency 4 times that of the write clock WCK.

Figure 20:
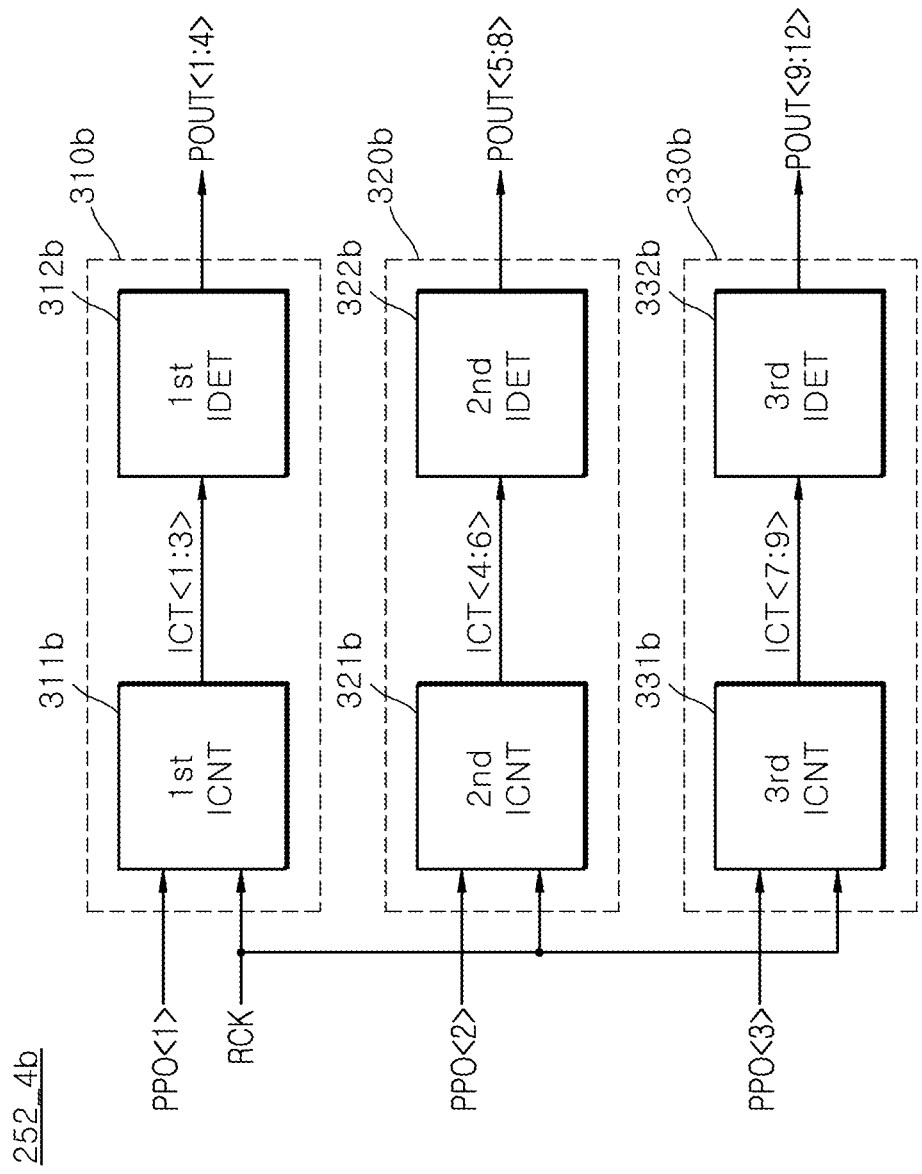
FIG. 20 is a block diagram illustrating a configuration of an output control signal output circuit included in the output control signal generation circuit shown in FIG. 19, according to an embodiment of the present disclosure.

FIG. 20 is a block diagram illustrating a configuration of the output control signal output circuit 252_4b included in the output control signal generation circuit 252b shown in FIG. 19, according to an embodiment. As shown in FIG. 20, the output control signal output circuit 252_4b may include a first output control circuit 310b, a second output control circuit 320b, and a third output control circuit 330b.

The first output control circuit 310b may include a first internal counter 311b, and a first internal detection circuit 312b.

The first internal counter 311b may generate first to third internal counting signals ICT<1:3> that are sequentially counted in synchronization with a rising edge of the read clock RCK when the first pre-output control signal PPO<1> is enabled. The first internal counter 311b may generate the first to third internal counting signals ICT<1:3> that are up-counted from "000" to "001" in synchronization with the rising edge of the read clock RCK when the first pre-output control signal PPO<1> is enabled. The first internal counter 311b may generate the first to third internal counting signals ICT<1:3> that are up-counted from "001" to "010" in synchronization with the rising edge of the read clock RCK when the first pre-output control signal PPO<1> is enabled. The first internal counter 311b may generate the first to third internal counting signals ICT<1:3> that are up-counted from "010" to "011" in synchronization with the rising edge of the read clock RCK when the first pre-output control signal PPO<1> is enabled. The first internal counter 311b may generate the first to third internal counting signals ICT<1:3> that are up-counted from "011" to "100" in synchronization with the rising edge of the read clock RCK when the first pre-output control signal PPO<1> is enabled. The first internal counter 311b may generate the first to third internal counting signals ICT<1:3> that are initialized to "000" when the first pre-output control signal PPO<1> is disabled.

The first internal detection circuit 312b may detect the logic level combination of the first to third internal counting signals ICT<1:3> to generate the first to fourth output control signals POUT<1:4>. The first internal detection circuit 312b may generate the first output control signal POUT<1> that is enabled when the first to third internal counting signals ICT<1:3> are generated as "001". The first internal detection circuit 312b may generate the second output control signal POUT<2> that is enabled when the first to third internal counting signals ICT<1:3> are generated as "010". The first internal detection circuit 312b may generate the third output control signal POUT<3> that is enabled when the first to third internal counting signals ICT<1:3> are generated as "011". The first internal detection circuit 312b may generate the fourth output control signal POUT<4> that is enabled when the first to third internal counting signals ICT<1:3> are generated as "100".

The second output control circuit 320b may include a second internal counter 321b and a second internal detection circuit 322b.

The second internal counter 321b may generate fourth to sixth internal counting signals ICT<4:6> that are sequentially counted in synchronization with the rising edge of the read clock RCK when the second pre-output control signal PPO<2> is enabled. The second internal counter 321b may generate the fourth to sixth internal counting signals ICT<4:6> that are up-counted from "000" to "001" in synchronization with the rising edge of the read clock RCK when the second pre-output control signal PPO<2> is enabled. The second internal counter 321b may generate the fourth to sixth internal counting signals ICT<4:6> that are up-counted from "001" to "010" in synchronization with the rising edge of the read clock RCK when the second pre-output control signal PPO<2> is enabled. The second internal counter 321b may generate the fourth to sixth internal counting signals ICT<4:6> that are up-counted from "010" to "011" in synchronization with the rising edge of the read clock RCK when the second pre-output control signal PPO<2> is enabled. The second internal counter 321b may generate the fourth to sixth internal counting signals ICT<4:6> that are up-counted from "011" to "100" in synchronization with the rising edge of the read clock RCK when the second pre-output control signal PPO<2> is enabled. The second internal counter 321*b* may generate the fourth to sixth internal counting signals ICT<4:6> that are initialized to "000" when the second pre-output control signal PPO<2> is disabled.

The second internal detection circuit 322*b* may detect the logic level combination of the fourth to sixth internal counting signals ICT<4:6> to generate the fifth to eighth output control signals POUT<5:8>. The second internal detection circuit 322*b* may generate the fifth output control signal POUT<5> that is enabled when the fourth to sixth internal counting signals ICT<4:6> are generated as "001". The second internal detection circuit 322*b* may generate the sixth output control signal POUT<6> that is enabled when the fourth to sixth internal counting signals ICT<4:6> are generated as "010". The second internal detection circuit 322*b* may generate the seventh output control signal POUT<7> that is enabled when the fourth to sixth internal counting signals ICT<4:6> are generated as "011". The second internal detection circuit 322*b* may generate the eighth output control signal POUT<8> that is enabled when the fourth to sixth internal counting signals ICT<4:6> are generated as "100".

The third output control circuit 330*b* may include a third internal counter 331*b* and a third internal detection circuit 332*b*.

The third internal counter 331*b* may generate seventh to ninth internal counting signals ICT<7:9> that are sequentially counted in synchronization with the rising edge of the read clock RCK when the third pre-output control signal PPO<3> is enabled. The third internal counter 331*b* may generate the seventh to ninth internal counting signals ICT<7:9> that are up-counted from "000" to "001" in synchronization with the rising edge of the read clock RCK when the third pre-output control signal PPO<3> is enabled. The third internal counter 321*b* may generate the seventh to ninth internal counting signals ICT<7:9> that are up-counted from "001" to "010" in synchronization with the rising edge of the read clock RCK when the third pre-output control signal PPO<3> is enabled. The third internal counter 331*b* may generate the seventh to ninth internal counting signals ICT<7:9> that are up-counted from "010" to "011" in synchronization with the rising edge of the read clock RCK when the third pre-output control signal PPO<3> is enabled. The third internal counter 331*b* may generate the seventh to ninth internal counting signals ICT<7:9> that are up-counted from "011" to "100" in synchronization with the rising edge of the read clock RCK when the third pre-output control signal PPO<3> is enabled. The third internal counter 331*b* may generate the seventh to ninth internal counting signals ICT<7:9> that are initialized to "000" when the third pre-output control signal PPO<3> is disabled.

The third internal detection circuit 332*b* may detect the logic level combination of the seventh to ninth internal counting signals ICT<7:9> to generate the ninth to twelfth output control signals POUT<9:12>. The third internal detection circuit 332*b* may generate the ninth output control signal POUT<9> that is enabled when the seventh to ninth internal counting signals ICT<7:9> are generated as "001". The third internal detection circuit 332*b* may generate the tenth output control signal POUT<10> that is enabled when the seventh to ninth internal counting signals ICT<7:9> are generated as "010". The third internal detection circuit 332*b* may generate the eleventh output control signal POUT<11> that is enabled when the seventh to ninth internal counting signals ICT<7:9> are generated as "011". The third internal detection circuit 332*b* may generate the twelfth output control signal POUT<12> that is enabled when the seventh to ninth internal counting signals ICT<7:9> are generated as "100".

Figure 21:
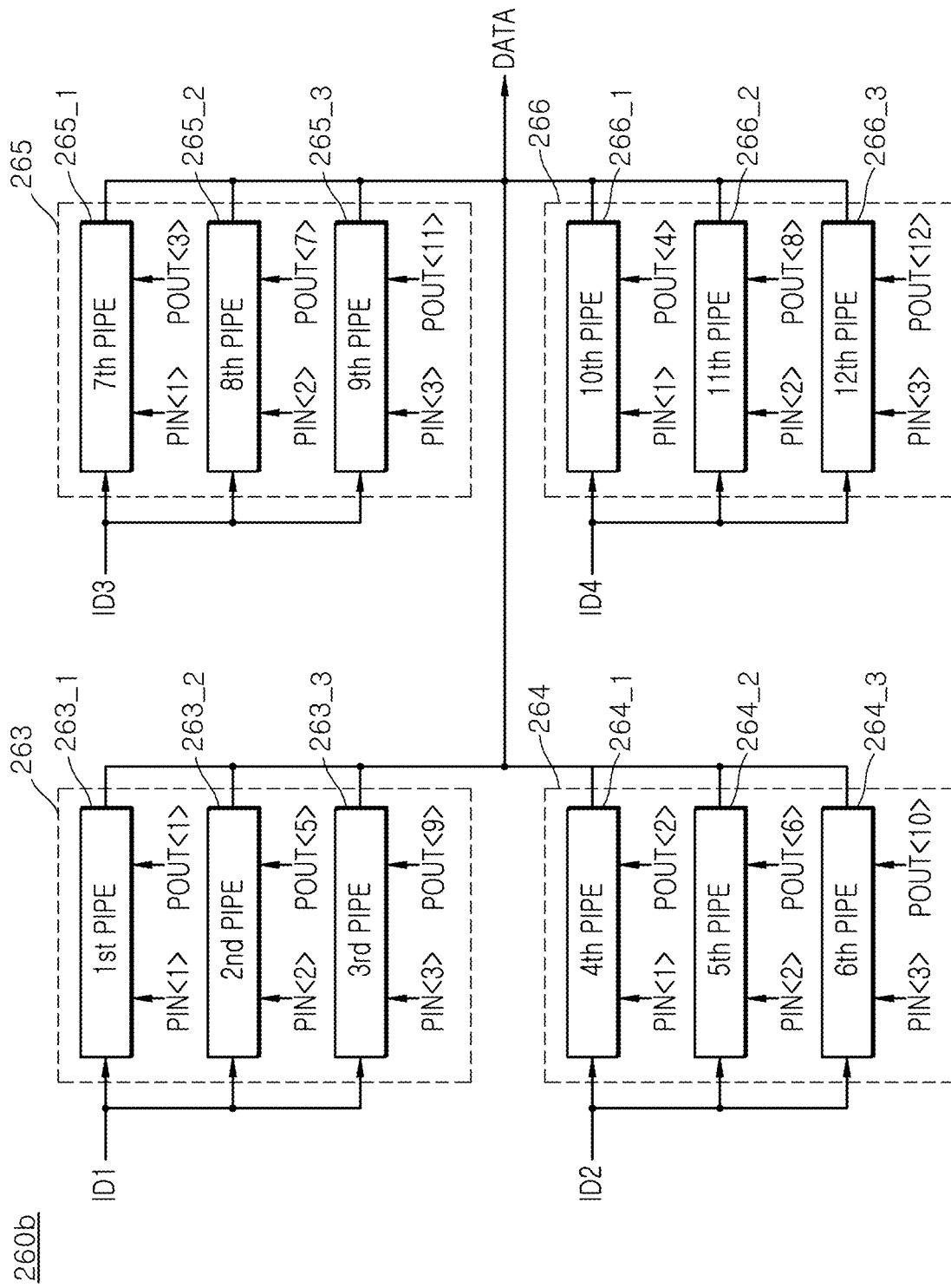
FIG. 21 is a block diagram illustrating a configuration of data input/output circuit included in the data input/output device shown in FIG. 16, according to an embodiment of the present disclosure.

FIG. 21 is a block diagram illustrating a configuration of the data input/output circuit 260*b* included in the data input/output device 20*b* shown in FIG. 16, according to an embodiment of the present disclosure. As shown in FIG. 21, the data input/output circuit 260*b* may include a first data input/output circuit 263, a second data input/output circuit 264, a third data input/output circuit 265, and a fourth data input/output circuit 266.

The first data input/output circuit 263 may include a first pipe circuit 263_1, a second pipe circuit 263_2, and a third pipe circuit 263_3. The first pipe circuit 263_1 may be synchronized with the first input control signal PIN<1> to latch a first bit of the internal data ID1. The first pipe circuit 263_1 may be synchronized with the first output control signal POUT<1> to output the latched first bit of the first internal data ID1 as a first bit of the data DATA. The second pipe circuit 263_2 may be synchronized with the second input control signal PIN<2> to latch a second bit of the first internal data ID1. The second pipe circuit 263_2 may be synchronized with the fifth output control signal POUT<5> to output the latched second bit of the first internal data ID1 as a fifth bit of the data DATA. The third pipe circuit 263_3 may be synchronized with the third input control signal PIN<3> to latch a third bit of the first internal data ID1. The third pipe circuit 263_3 may be synchronized with the ninth output control signal POUT<9> to output the latched third bit of the first internal data ID1 as a ninth bit of the data DATA. The first data input/output circuit 263 is implemented to include three pipe circuits, but may be implemented to include various numbers of pipe circuits according to embodiments.

The second data input/output circuit 264 may include a fourth pipe circuit 264_1, a fifth pipe circuit 264_2, and a sixth pipe circuit 264_3. The fourth pipe circuit 264_1 may be synchronized with the first input control signal PIN<1> to latch a first bit of the second internal data ID2. The fourth pipe circuit 264_1 may be synchronized with the second output control signal POUT<2> to output the latched first bit of the second internal data ID2 as a second bit of the data DATA. The fifth pipe circuit 264_2 may be synchronized with the second input control signal PIN<2> to latch a second bit of the second internal data ID2. The fifth pipe circuit 264_2 may be synchronized with the sixth output control signal POUT<6> to output the latched second bit of the second internal data ID2 as a sixth bit of the data DATA. The sixth pipe circuit 264_3 may be synchronized with the third input control signal PIN<3> to latch a third bit of the second internal data ID2. The sixth pipe circuit 264_3 may be synchronized with the tenth output control signal POUT<10> to output the latched third bit of the second internal data ID2 as a tenth bit of the data DATA. The second data input/output circuit 264 is implemented to include three pipe circuits, but may be implemented to include various numbers of pipe circuits according to embodiments.

The third data input/output circuit 265 may include a seventh pipe circuit 265_1, an eighth pipe circuit 265_2, and a ninth pipe circuit 265_3. The seventh pipe circuit 265_1 may be synchronized with the first input control signal PIN<1> to latch a first bit of the third internal data ID3. The seventh pipe circuit 265_1 may be synchronized with the third output control signal POUT<3> to output the latched first bit of the third internal data ID3 as a third bit of the data DATA. The eighth pipe circuit 265_2 may be synchronized with the second input control signal PIN<2> to latch a second bit of the third internal data ID3. The eighth pipe circuit 265_2 may be synchronized with the seventh output control signal POUT<7> to output the latched second bit of the third internal data ID3 as a seventh bit of the data DATA. The ninth pipe circuit 265_3 may be synchronized with the third input control signal PIN<3> to latch a third bit of the third internal data ID3. The ninth pipe circuit 265_3 may be synchronized with the eleventh output control signal POUT<11> to output the latched third bit of the third internal data ID3 as an eleventh bit of the data DATA. The third data input/output circuit 265 is implemented to include three pipe circuits, but may be implemented to include various numbers of pipe circuits according to embodiments.

The fourth data input/output circuit 266 may include a tenth pipe circuit 266_1, an eleventh pipe circuit 266_2, and a twelfth pipe circuit 266_3. The tenth pipe circuit 266_1 may be synchronized with the first input control signal PIN<1> to latch a first bit of the fourth internal data ID4. The tenth pipe circuit 266_1 may be synchronized with the fourth output control signal POUT<4> to output the latched first bit of the fourth internal data ID4 as a fourth bit of the data DATA. The eleventh pipe circuit 266_2 may be synchronized with the second input control signal PIN<2> to latch a second bit of the fourth internal data ID4. The eleventh pipe circuit 266_2 may be synchronized with the eighth output control signal POUT<8> to output the latched second bit of the fourth internal data ID4 as an eighth bit of the data DATA. The twelfth pipe circuit 266_3 may be synchronized with the third input control signal PIN<3> to latch a third bit of the fourth internal data ID4. The twelfth pipe circuit 266_3 may be synchronized with the twelfth output control signal POUT<12> to output the latched third bit of the fourth internal data ID4 as a twelfth bit of the data DATA. The fourth data input/output circuit 266 is implemented to include three pipe circuits, but may be implemented to include various numbers of pipe circuits according to embodiments.

Unlike the data input/output device 20 described above with reference to FIGS. 1 to 12, the data input/output device 20b shown in FIGS. 16 to 21 according to another embodiment of the present disclosure may operate in the second mode (4:1 MODE) and perform the same operation except for generating 4-bit data during one cycle of the write clock WCK. Accordingly, detailed operation descriptions will be omitted.

The above-described data input/output device 20b may perform the domain crossing operation of converting a low-frequency write clock to a high-frequency read clock, convert parallel data into serial data, and output converted data. In the second mode (4:1 MODE), the data input/output device 20b may be synchronized with the read clock having a frequency 4 times higher than that of the write clock, serialize the parallel data during one cycle of the write clock, and continuously output 4-bit serial data.

Figure 22:
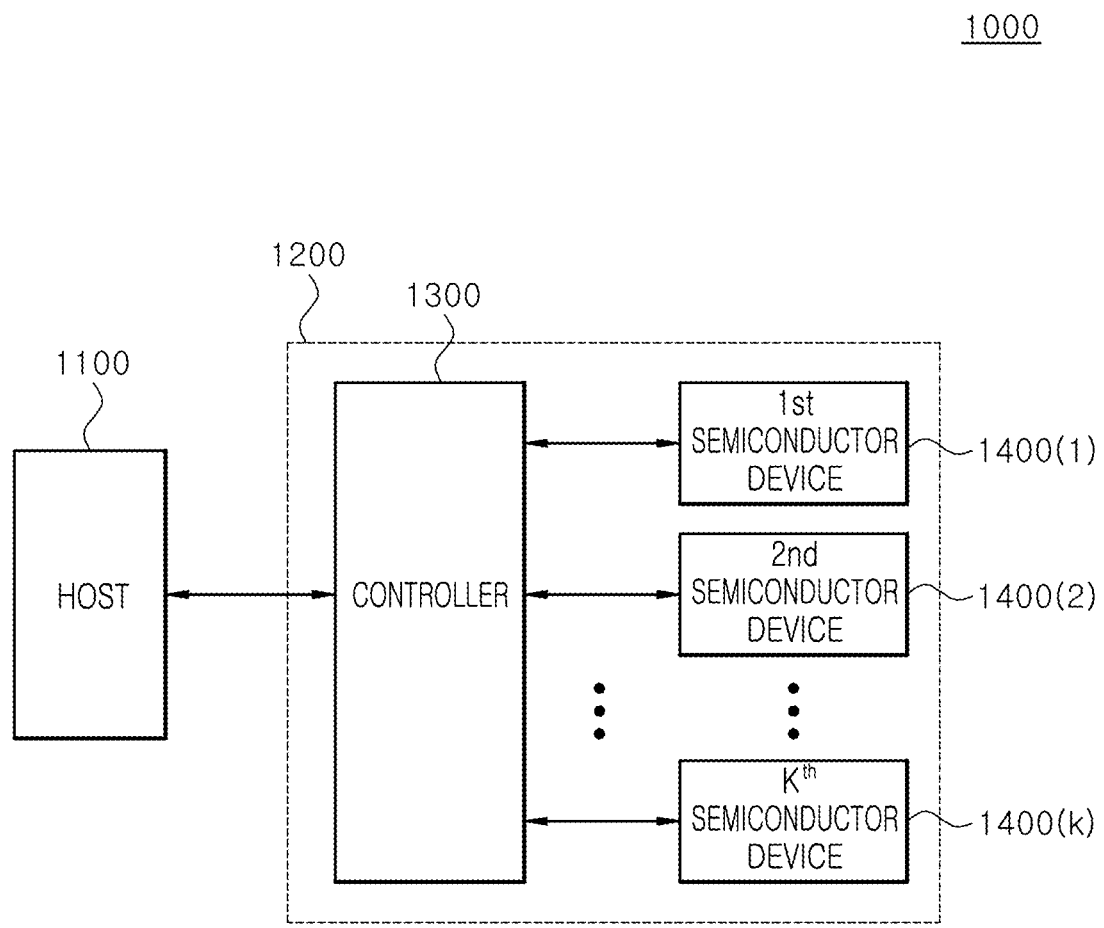
FIG. 22 is a diagram illustrating a configuration an electronic system to which the systems shown in FIGS. 1 to 21 are applied, according to an embodiment of the present disclosure.

FIG. 22 is a block diagram illustrating a configuration of an electronic system 1000 according to an embodiment of the present disclosure. The electronic system 1000 shown in FIG. 22 may include a host 1100 and a semiconductor system 1200.

The host 1100 and the semiconductor system 1200 may transmit signals to each other using interface protocols. The interface protocols used between the host 1100 and the semiconductor system 1200 may include a multi-media card (MMC), an enhanced small disk interface (ESDI), integrated drive electronics (IDE), peripheral component interconnect-express (PCI-e or PCIe), advanced technology attachment (ATA), serial ATA (SATA), parallel ATA (PATA), serial attached SCSI (SAS), universal serial bus (USB), and the like.

The semiconductor system 1200 may include a controller 1300 and semiconductor devices 1400(1:K). The controller 1300 may control the semiconductor devices 1400(1:K) to perform a read operation. Each of the semiconductor devices 1400(1: K) may perform a domain crossing operation of converting a low-frequency write clock to a high-frequency read clock, convert parallel data into serial data, and output the converted data. Each of the semiconductor devices 1400(1:K) may be synchronized with the read clock having a frequency twice that of the write clock in the first mode (2:1 MODE), serialize the parallel data during one cycle of the write clock, and continuously output 4-bit serial data. Each of the semiconductor devices 1400(1:K) may be synchronized with the read clock having a frequency four times that of the write clock in the second mode (4:1 MODE), serialize the parallel data during one cycle of the write clock, and continuously output 4-bit serial data.

The semiconductor devices 1400(K:1) may perform the domain crossing operation from the low-frequency write clock to the high-frequency read clock, convert the parallel data into serial data, and output the converted data, so that the semiconductor system 1200 may simultaneously perform the domain crossing operation and the serialization operation.

The controller 1300 may be implemented with the controller 10 described above with reference to FIG. 1. Each of the semiconductor devices 1400(1:K) may be implemented with the data input/output device 20 described above with reference to FIG. 1, the data input/output device 20a described above with reference to FIG. 13, and the data input/output device 20b described above with reference to FIG. 16. According to embodiments, each of the semiconductor devices 1400(1:K) may be implemented with one of a dynamic random access memory (DRAM) device, a phase change random access memory (PRAM) device, a resistive random access memory (RRAM) device, a magnetic random access memory (MRAM) device, and ferroelectric random access memory (FRAM) device.

Concepts have been disclosed in conjunction with the embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts. Furthermore, the embodiments may be combined to form additional embodiments.

What is claimed is:
1. A data input/output device comprising:
a control circuit configured to:
  generate a plurality input control signals in synchronization with a write clock,
  perform a domain crossing operation of converting a write clock into a read clock, and
  generate a plurality of output control signals based on an output counting signal generated through the domain crossing operation; and
a data input/output circuit configured to:

latch, in synchronization with the plurality of input control signals, a plurality of pieces of internal data input in parallel, and serialize, in synchronization with the plurality of output control signals, the latched plurality pieces of internal data to generate data.

2. The data input/output device of claim 1, wherein the read clock is a signal having a frequency 2N times that of the write clock, where "N" is a positive integer.

3. The data input/output device of claim 1, wherein the control circuit performs the domain crossing operation by latching the write clock at a rising edge or a falling edge of the read clock based on a selection signal.

4. The data input/output device of claim 3, wherein the selection signal is enabled when a pulse of the write clock is generated at an odd-numbered pulse of the read clock and disabled when the pulse of the write clock is not generated at the odd-numbered pulse of the read clock.

5. The data input/output device of claim 1, wherein a number of the plurality of output control signals is 2N times a number of the plurality of input control signals, where "N" is a positive integer.

6. The data input/output device of claim 1, wherein when the read clock is set as a signal having a frequency 2N times that of the write clock, a number of the plurality of output control signals is 2N times a number of the plurality of input control signals, where "N" is a positive integer.

7. The data input/output device of claim 1,
wherein the control circuit generates 2N number of the input control signals, where "N" is a positive integer, and
wherein a number of the plurality of internal data is 2N.

8. The data input/output device of claim 1,
wherein the plurality of input control signals include first and second input control signals,
wherein the plurality of output control signals include first to fourth output control signals, and
wherein the control circuit includes:
an input control signal generation circuit configured to generate the first and second input control signals that are sequentially enabled in synchronization with a rising edge of the write clock; and an output control signal generation circuit configured to perform the domain crossing operation and output the first to fourth output control signals that are sequentially enabled at a rising edge of the read clock.

9. The data input/output device of claim 8, wherein the input control signal generation circuit includes:
a write counting signal generation circuit configured to generate first and second write counting signals that are sequentially counted in synchronization with the rising edge of the write clock; and
a write counting signal detection circuit configured to detect a logic level combination of the first and second write counting signals to generate the first and second input control signals.

10. The data input/output device of claim 8, wherein the output control signal generation circuit includes:
an output counting signal generation circuit configured to perform, in order to generate the output counting signal, the domain crossing operation by latching, based on a selection signal, the write clock at a falling edge of the read clock or at the rising edge of the read clock;
a read counting signal generation circuit configured to generate first and second read counting signals that are sequentially counted in synchronization with a rising edge of the output counting signal;

a read counting signal detection circuit configured to detect a logic level combination of the first and second read counting signals to generate first and second pre-output control signals; and
an output control signal output circuit configured to:
generate the first and second output control signals that are sequentially enabled when the first pre-output control signal is enabled in synchronization with the read clock, and
generate the third and fourth output control signals that are sequentially enabled when the second pre-output control signal is enabled in synchronization with the read clock.

11. The data input/output device of claim 10, wherein the output control signal output circuit includes:
a first output control circuit configured to generate the first and second output control signals that are sequentially enabled in synchronization with the rising edge of the read clock when the first pre-output control signal is enabled; and
a second output control circuit configured to generate the third and fourth output control signals that are sequentially enabled in synchronization with the rising edge of the read clock when the second pre-output control signal is enabled.

12. The data input/output device of claim 11, wherein the first output control circuit includes:
a first internal counter configured to generate first and second internal counting signals that are counted in synchronization with the rising edge of the read clock when the first pre-output control signal is enabled; and
a first internal detection circuit configured to detect a logic level combination of the first and second internal counting signals to generate the first and second output control signals.

13. The data input/output device of claim 11, wherein the second output control circuit includes:
a second internal counter configured to generate third and fourth internal counting signals that are counted in synchronization with the rising edge of the read clock when the second pre-output control signal is enabled; and
a second internal detection circuit configured to detect a logic level combination of the third and fourth internal counting signals to generate the third and fourth output control signals.

14. The data input/output device of claim 1,
wherein the plurality of input control signals include first and second input control signals,
wherein the plurality of output control signals include first to fourth output control signals,
wherein the plurality of pieces of internal data include first internal data and second internal data, and
wherein the data input/output circuit includes:
a first data input/output circuit configured to:
latch a first bit and a second bit of the first internal data in synchronization with the first and second input control signals, and
sequentially output the latched first bit and the second bit of the first internal data as a first bit and a third bit of the data in synchronization with the first and third output control signals, respectively; and a second data input/output circuit configured to:
latch a first bit and a second bit of the second internal data in synchronization with the first and second input control signals, and sequentially output the latched first bit and the second bit of the second internal data as a second bit and a fourth bit of the data in synchronization with the first and third output control signals, respectively.

15. The data input/output device of claim 14, wherein the first data input/output circuit includes:
a first pipe circuit configured to:
latch the first bit of the first internal data in synchronization with the first input control signal, and
output the latched first bit of the first internal data as the first bit of the data in synchronization with the first output control signal; and
a second pipe circuit configured to:
latch the second bit of the first internal data in synchronization with the second input control signal, and
output the latched first bit of the first internal data as the third bit of the data in synchronization with the third output control signal.

16. The data input/output device of claim 1, wherein the second data input/output circuit includes:
a third pipe circuit configured to:
latch the first bit of the second internal data in synchronization with the first input control signal, and
output the latched first bit of the second internal data as the second bit of the data in synchronization with the second output control signal; and
a fourth pipe circuit configured to:
latch the second bit of the second internal data in synchronization with the fourth input control signal, and
output the latched second bit of the second internal data as the fourth bit of the data in synchronization with the fourth output control signal.

17. A data input/output device comprising:
a control circuit configured to:
generate a plurality input control signals in synchronization with a write clock,
perform a domain crossing operation by delaying the write clock and a read clock by delay amounts respectively set by a write code and a read code, and
generate a plurality of output control signals based on an output counting signal generated through the domain crossing operation; and
a data input/output circuit configured to:
latch, in synchronization with the plurality of input control signals, a plurality of pieces of internal data input in parallel, and
serialize, in synchronization with the plurality of output control signals, the latched plurality of pieces of internal data to generate data.

18. The data input/output device of claim 17, wherein the write code and the read code are signals for adjusting the delay amounts to generate a pulse of the write clock at a rising edge of the read clock.

19. The data input/output device of claim 17, wherein the read clock is a signal having a frequency 2N times that of the write clock, where "N" is a positive integer.

20. The data input/output device of claim 17, wherein a number of the plurality of output control signals is 2N times a number of the plurality of input control signals, where "N" is a positive integer.

21. The data input/output device of claim 17, wherein when the read clock is set as a signal having a frequency 2N times that of the write clock, a number of the plurality of output control signals is 2N times a number of the plurality of input control signals, where "N" is a positive integer.

22. The data input/output device of claim 17, wherein the control circuit generates 2N number of the input control signals, where "N" is a positive integer and
wherein a number of the plurality of internal data is 2N.

23. The data input/output device of claim 17, wherein the plurality of input control signals include first and second input control signals,
wherein the plurality of output control signals include first to fourth output control signals, and
wherein the control circuit includes:
an input control signal generation circuit configured to generate the first and second input control signals that are sequentially enabled in synchronization with a rising edge of the write clock; and
an output control signal generation circuit configured to:
generate a delayed write clock and a delayed read clock by delaying the write clock and the read clock, respectively by the delay amounts set by the write code and the read code,
perform the domain crossing operation of converting the delayed write clock into the delayed read clock, and
generate the first to fourth output control signals that are sequentially enabled at a rising edge of the delayed read clock.

24. The data input/output device of claim 23, wherein the input control signal generation circuit includes:
a write counting signal generation circuit configured to generate first and second write counting signals that are sequentially counted in synchronization with the rising edge of the write clock; and
a write counting signal detection circuit configured to detect a logic level combination of the first and second write counting signals to generate the first and second input control signals.

25. The data input/output device of claim 23, wherein the output control signal generation circuit includes:
an output counting signal generation circuit configured to:
delay the write clock and the read clock by the delay amounts respectively set by the write code and the read code to generate the delayed write clock and the delayed read clock, and
perform the domain crossing operation to generate the output counting signal;
a read counting signal generation circuit configured to generate first and second read counting signals that are sequentially counted in synchronization with a rising edge of the output counting signal;
a read counting signal detection circuit configured to detect a logic level combination of the first and second read counting signals to generate first and second pre-output control signals; and
an output control signal output circuit configured to:
generate the first and second output control signals that are sequentially enabled when the first pre-output control signal is enabled in synchronization with the read clock, and
generate the third and fourth output control signals that are sequentially enabled when the second pre-output control signal is enabled in synchronization with the read clock.

26. The data input/output device of claim 25, wherein the output control signal output circuit includes:
a first output control circuit configured to generate the first and second output control signals that are sequentially enabled in synchronization with the rising edge of the read clock when the first pre-output control signal is enabled; and a second output control circuit configured to generate the third and fourth output control signals that are sequentially enabled in synchronization with the rising edge of the read clock when the second pre-output control signal is enabled.

27. The data input/output device of claim 26, wherein the first output control circuit includes:
   a first internal counter configured to generate first and second internal counting signals that are counted in synchronization with the rising edge of the read clock when the first pre-output control signal is enabled; and
   a first internal detection circuit configured to detect a logic level combination of the first and second internal counting signals to generate the first and second output control signals.

28. The data input/output device of claim 26, wherein the second output control circuit includes:
   a second internal counter configured to generate third and fourth internal counting signals that are counted in synchronization with the rising edge of the read clock when the second pre-output control signal is enabled; and
   a second internal detection circuit configured to detect a logic level combination of the third and fourth internal counting signals to generate the third and fourth output control signals.

29. The data input/output device of claim 17,
   wherein the plurality of input control signals include first and second input control signals,
   wherein the plurality of output control signals include first to fourth output control signals,
   wherein the plurality of pieces of internal data include first internal data and second internal data, and
   wherein the data input/output circuit includes:
   a first data input/output circuit configured to:
      latch a first bit and a second bit of the first internal data in synchronization with the first and second input control signals, and
      sequentially output the latched first bit and the second bit of the first internal data as a first bit and a third bit of the data, respectively in synchronization with the first and third output control signals; and
   a second data input/output circuit configured to:
      latch a first bit and a second bit of the second internal data in synchronization with the first and second input control signals, and
      sequentially output the latched first bit and the second bit of the second internal data as a second bit and a fourth bit of the data, respectively in synchronization with the first and third output control signals.

30. The data input/output device of claim 29, wherein the first data input/output circuit includes:
   a first pipe circuit configured to:
      latch the first bit of the first internal data in synchronization with the first input control signal, and
      output the latched first bit of the first internal data as the first bit of the data in synchronization with the first output control signal; and
   a second pipe circuit configured to:
      latch the second bit of the first internal data in synchronization with the second input control signal, and
      output the latched first bit of the first internal data as the third bit of the data in synchronization with the third output control signal.

31. The data input/output device of claim 29, wherein the second data input/output circuit includes:
   a third pipe circuit configured to:
      latch the first bit of the second internal data in synchronization with the first input control signal, and
      output the latched first bit of the second internal data as the second bit of the data in synchronization with the second output control signal; and
   a fourth pipe circuit configured to:
      latch the second bit of the second internal data in synchronization with the fourth input control signal, and
      output the latched second bit of the second internal data as the fourth bit of the data in synchronization with the fourth output control signal.

* * * * *